(12) United States Patent
Fujii et al.

(10) Patent No.: US 12,197,132 B2
(45) Date of Patent: Jan. 14, 2025

(54) EXPOSURE SYSTEM AND METHOD FOR MANUFACTURING ELECTRONIC DEVICES

(71) Applicant: Gigaphoton Inc., Tochigi (JP)

(72) Inventors: Koichi Fujii, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 164 days.

(21) Appl. No.: 17/817,190

(22) Filed: Aug. 3, 2022

(65) Prior Publication Data
US 2022/0373896 A1    Nov. 24, 2022

Related U.S. Application Data

(63) Continuation of application No. PCT/JP2020/012414, filed on Mar. 19, 2020.

(51) Int. Cl.
*G03F 7/00*   (2006.01)
*H01S 3/225*  (2006.01)
*H01S 5/12*   (2021.01)

(52) U.S. Cl.
CPC ...... *G03F 7/70041* (2013.01); *G03F 7/70025* (2013.01); *G03F 7/70358* (2013.01);
(Continued)

(58) Field of Classification Search
CPC .................. G03F 7/70575; G03F 7/70125
See application file for complete search history.

(56) References Cited

U.S. PATENT DOCUMENTS

| 5,895,737 A * | 4/1999 | McCullough ....... G03F 7/70558 |
| | | 430/30 |
| 2003/0227607 A1 | 12/2003 | Kato et al. |

(Continued)

FOREIGN PATENT DOCUMENTS

| DE | 102011080919 A1 * | 7/2012 | ......... G03F 7/70125 |
| JP | 2000-031028 A | 1/2000 | |

(Continued)

OTHER PUBLICATIONS

Machine translation of DE-102011080919-A1 (Year: 2011).*
(Continued)

*Primary Examiner* — Steven H Whitesell
(74) *Attorney, Agent, or Firm* — Studebaker & Brackett PC

(57) ABSTRACT

An exposure system according to an aspect of the present disclosure includes a laser apparatus that outputs pulsed laser light, an illuminating optical system that guides the pulsed laser light to a reticle, a reticle stage, and a processor that controls the output of the pulsed laser light from the laser apparatus and the movement of the reticle performed by the reticle stage. The reticle has a first region where a first pattern is disposed and a second region where a second pattern is disposed, and the first and second regions are each a region continuous in a scan width direction perpendicular to a scan direction of the pulsed laser light, with the first and second regions arranged side by side in the scan direction. The processor controls the laser apparatus to output the pulsed laser light according to each of the first and second regions by changing the values of control parameters of the pulsed laser light in accordance with each of the first and second regions.

7 Claims, 25 Drawing Sheets

(52) U.S. Cl.
CPC ...... *G03F 7/70508* (2013.01); *G03F 7/70558* (2013.01); *G03F 7/70575* (2013.01); *H01S 3/225* (2013.01); *H01S 5/12* (2013.01)

(56) References Cited

U.S. PATENT DOCUMENTS

| | | |
|---|---|---|
| 2004/0012844 A1 | 1/2004 | Ohtsuki et al. |
| 2006/0035160 A1 | 2/2006 | Troost et al. |
| 2007/0242363 A1 | 10/2007 | Noboru et al. |
| 2009/0117494 A1 | 5/2009 | Owa |
| 2011/0205512 A1 | 8/2011 | Seong et al. |
| 2015/0070673 A1 | 3/2015 | Lalovic et al. |
| 2015/0355025 A1* | 12/2015 | Duffey ................ G03F 7/70041 355/67 |
| 2018/0196347 A1 | 7/2018 | Minegishi et al. |
| 2019/0245321 A1 | 8/2019 | Kakizaki et al. |

FOREIGN PATENT DOCUMENTS

| | | | |
|---|---|---|---|
| JP | 2001076995 A | * 3/2001 | ......... G03F 7/70358 |
| JP | 2007-287760 A | 11/2007 | |
| JP | 2010-238684 A | 10/2010 | |
| JP | 2014-042073 A | 3/2014 | |
| JP | 2016-127226 A | 7/2016 | |

OTHER PUBLICATIONS

Machine translation of JP-2001076995-A (Year: 2001).*
International Search Report issued in PCT/JP2020/012414; mailed Jun. 23, 2020.
International Preliminary Report on Patentability (Chapter I) and Written Opinion of the International Searching Authority issued in PCT/JP2020/012414; issued Sep. 20, 2022.
An Office Action mailed by the Japanese Patent Office on Sep. 8, 2023, which corresponds to Japanese Application No. 2022-507983 with English translation.

* cited by examiner

| No. | REGION | OPTIMAL WAVELENGTH $\lambda b$ | OPTIMAL SPECTRAL LINEWIDTH $\Delta \lambda b$ | OPTIMAL PULSE ENERGY Eb |
|---|---|---|---|---|
| 1 | A | $\lambda b(A)$ | $\Delta \lambda b(A)$ | $Eb(A)$ |
| 2 | B | $\lambda b(B)$ | $\Delta \lambda b(B)$ | $Eb(B)$ |

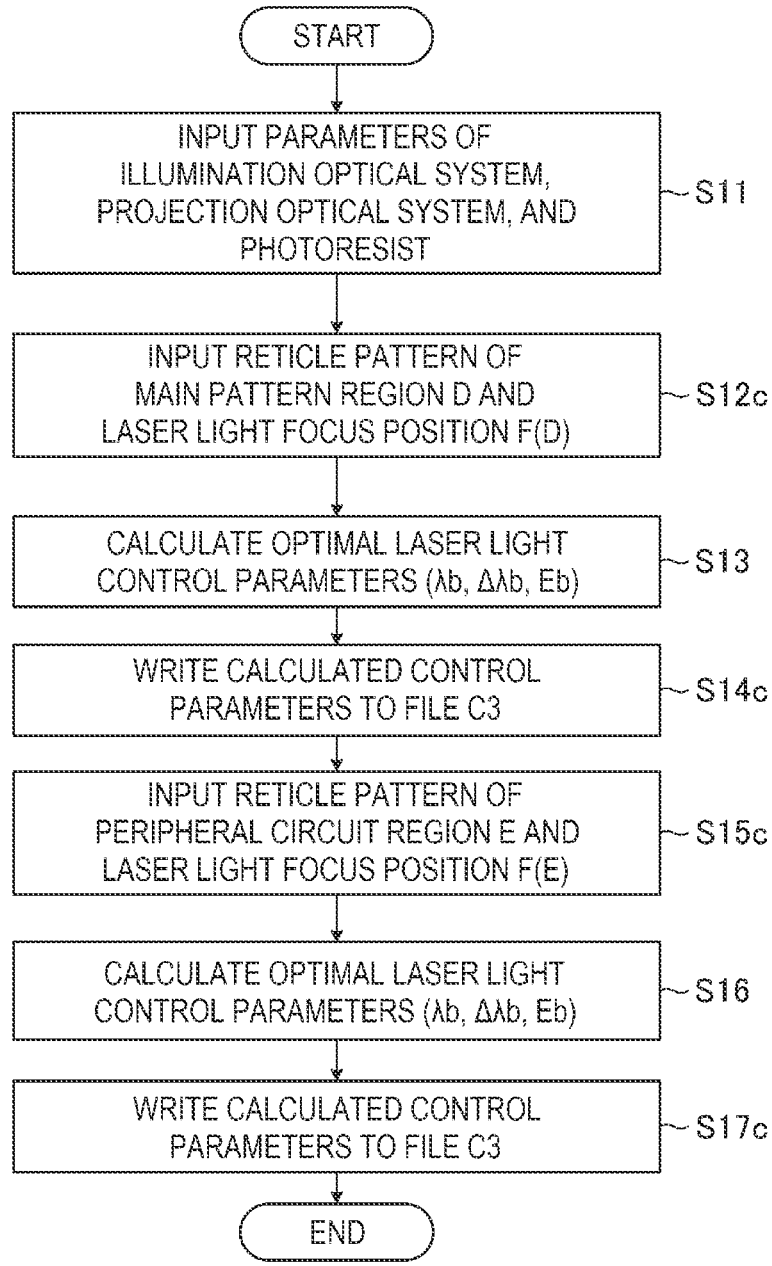

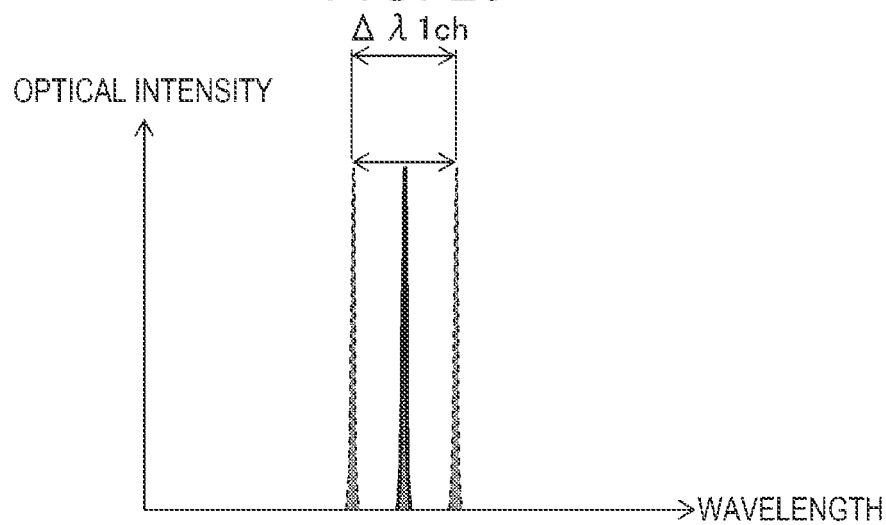
FIG. 29
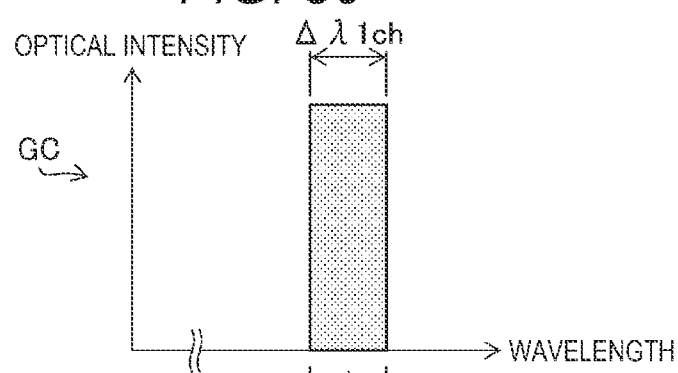
FIG. 30
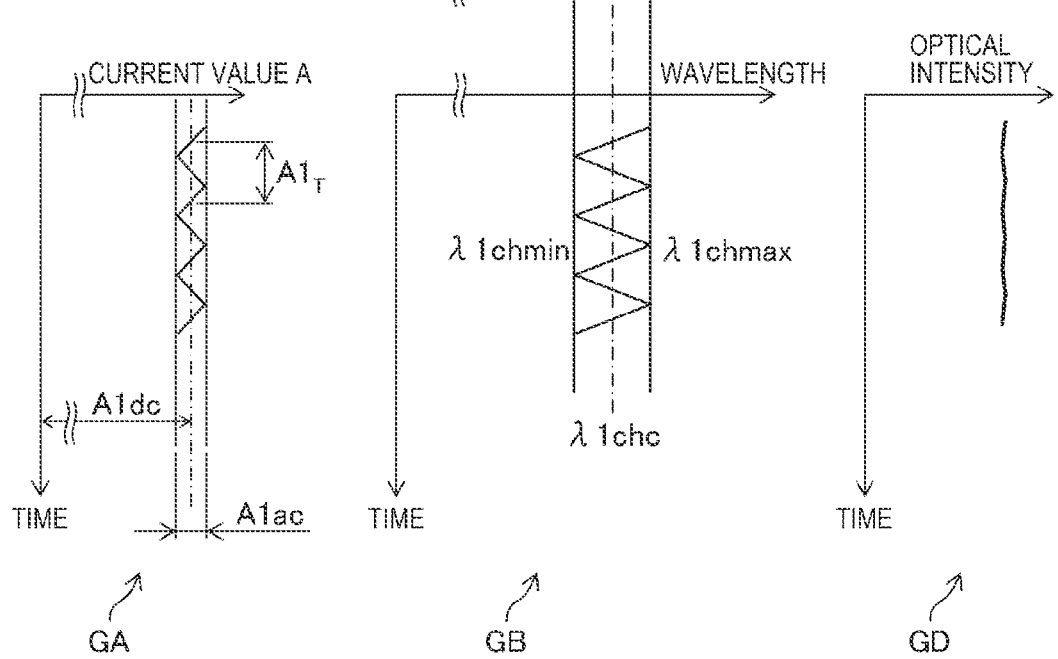

EXPOSURE SYSTEM AND METHOD FOR MANUFACTURING ELECTRONIC DEVICES

CROSS-REFERENCE TO RELATED APPLICATIONS

The present application is a continuation application of International Application No. PCT/JP2020/012414, filed on Mar. 19, 2020, the entire contents of which are hereby incorporated by reference.

BACKGROUND

1. Technical Field

The present disclosure relates to an exposure system and a method for manufacturing electronic devices.

2. Related Art

In recent years, a semiconductor exposure apparatus is required to improve the resolution thereof as semiconductor integrated circuits are increasingly miniaturized and highly integrated. To this end, reduction in the wavelength of light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

Light from spontaneously oscillating KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element (such as etalon and grating) is provided in a laser resonator of the gas laser apparatus to narrow the spectral linewidth in some cases. A gas laser apparatus providing a narrowed spectral linewidth is hereinafter referred to as a narrowed-line gas laser apparatus.

CITATION LIST

Patent Literature

[PTL 1] U.S. Patent Application Publication No. 2015/0070673
[PTL 2] U.S. Patent Application Publication No. 2011/0205512
[PTL 3] U.S. Patent Application Publication No. 2006/0035160
[PTL 4] U.S. Patent Application Publication No. 2003/0227607
[PTL 5] U.S. Patent Application Publication No. 2018/0196347
[PTL 6] U.S. Patent Application Publication No. 2019/0245321
[PTL 7] U.S. Patent Application Publication No. 2004/0012844

SUMMARY

An exposure system according to an aspect of the present disclosure is an exposure system configured to perform scan exposure on a semiconductor substrate by irradiating a reticle with pulsed laser light, the exposure system including a laser apparatus configured to output the pulsed laser light, an illumination optical system configured to guide the pulsed laser light to the reticle, a reticle stage configured to move the reticle, and a processor configured to control the output of the pulsed laser light from the laser apparatus and the movement of the reticle performed by the reticle stage, the reticle having a first region where a first pattern is disposed and a second region where a second pattern is disposed, the first and second regions each being a region continuous in a scan width direction perpendicular to a scan direction of the pulsed laser light, the first and second regions arranged side by side in the scan direction, and the processor configured to control the laser apparatus to output the pulsed laser light according to each of the first and second regions by changing values of control parameters of the pulsed laser light in accordance with each of the first and second regions.

A method for manufacturing electronic devices according to another aspect of the present disclosure includes performing scan exposure on a light sensitive substrate with a reticle irradiated with pulsed laser light to manufacture the electronic devices by using an exposure system including a laser apparatus configured to output the pulsed laser light, an illumination optical system configured to guide the pulsed laser light to the reticle, a reticle stage configured to move the reticle, and a processor configured to control the output of the pulsed laser light from the laser apparatus and the movement of the reticle performed by the reticle stage, the reticle having a first region where a first pattern is disposed and a second region where a second pattern is disposed, the first and second regions each being a region continuous in a scan width direction perpendicular to a scan direction of the pulsed laser light, the first and second regions arranged side by side in the scan direction, and the processor configured to control the laser apparatus to output the pulsed laser light according to each of the first and second regions by changing values of control parameters of the pulsed laser light in accordance with each of the first and second regions.

BRIEF DESCRIPTION OF THE DRAWINGS

Embodiments of the present disclosure will be described below only by way of example with reference to the accompanying drawings.

FIG. 22 is a flowchart showing an example of processes carried out by the lithography control unit in the third embodiment.

FIG. 23 is a conceptual diagram showing the data structure of a table saved in a file C3.

FIG. 29 is a conceptual view of the spectral linewidth achieved by chirping.

FIG. 30 is a diagrammatic view showing the relationship among the current flowing through a semiconductor laser, a change in the wavelength due to the chirping, the spectrum waveform, and the optical intensity.

DETAILED DESCRIPTION

Figure 1:
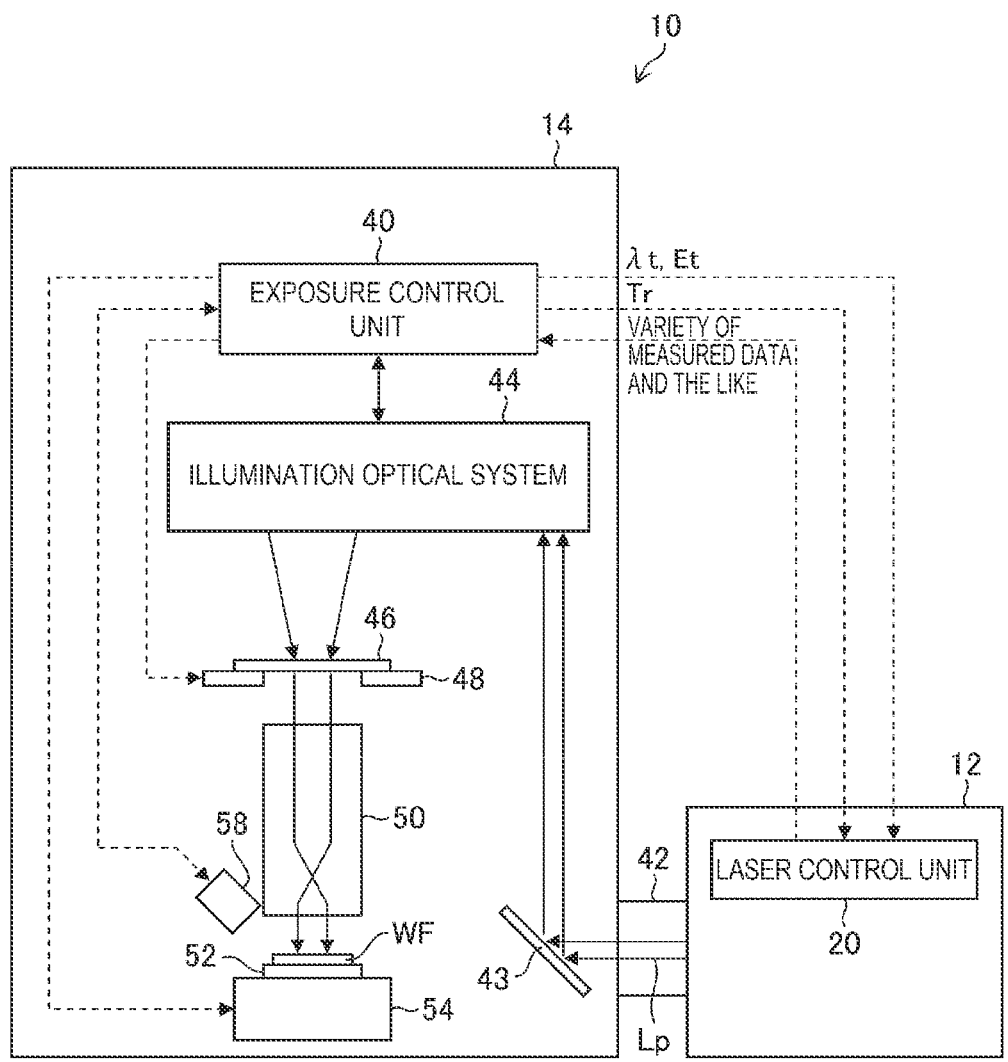
FIG. 1 schematically shows the configuration of an exposure system according to Comparative Example.

<Contents>
1. Description of terms
2. Overview of exposure system according to Comparative Example
   2.1 Configuration
   2.2 Operation
   2.3 Example of exposure operation performed on wafer
   2.4 Relationship between scan field and static exposure area
   2.5 Problems
3. First Embodiment
   3.1 Overview of lithography system
      3.1.1 Configuration
      3.1.2 Operation
   3.2 Example of laser apparatus
      3.2.1 Configuration
      3.2.2 Operation
      3.2.3 Others
   3.3 Band-shaped reticle pattern and example of trend of values of target laser light control parameters
   3.4 Example of contents of processes carried out by lithography control unit
   3.5 Example of contents of processes carried out by exposure control unit
   3.6 Example of contents of processes carried out by laser control unit
   3.7 Effects and advantages
   3.8 Others
4. Second Embodiment
   4.1 Configuration
   4.2 Operation
   4.3 Effects and advantages
   4.4 Variation
5. Third Embodiment
   5.1 Configuration
   5.2 Operation
   5.3 Example of contents of processes carried out by lithography control unit
   5.4 Example of contents of processes carried out by exposure control unit
   5.5 Effects and advantages
   5.6 Others
6. Fourth Embodiment
   6.1 Configuration
   6.2 Operation
   6.3 Effects and advantages
7. Example of excimer laser apparatus using solid-state laser apparatus as oscillator
   7.1 Configuration
   7.2 Operation
   7.3 Description of semiconductor laser system
      7.3.1 Configuration
      7.3.2 Operation
      7.3.3 Others
   7.4 Effects and advantages
   7.5 Others
8. Hardware configuration of various control units
9. Method for manufacturing electronic devices
10. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure.

The same component has the same reference character, and no redundant description of the same component will be made.

1. Description of Terms

The terms used in the present disclosure are defined as follows.

CD (critical dimension) refers to the dimensions of a micro-pattern formed on a wafer made, for example, of a semiconductor. In lithography, the CD value of a pattern changes in accordance not only with the dimensions of the pattern itself, but also with surrounding patterns. Therefore, for example, the post-exposure CD differs between a case where an isolated pattern is placed on a reticle and a case where patterns are adjacent to each other. The degree of the difference depends not only on the distance from another adjacent pattern, the density of the patterns, the type of the patterns, and other factors, but also on the settings of the optical system of the exposure apparatus used for exposure. Such an optical proximity effect is called an optical proximity effect (OPE). There is also a proximity effect manifesting itself in a development process and other processes during the development, although the proximity effect of this type is not an optical proximity effect.

An OPE curve is a graph drawn in a coordinate system having a horizontal axis representing the (through-pitch) pattern and a vertical axis representing the CD value or the difference between the CD value and a target CD value. The OPE curve is also called an OPE characteristic curve.

Optical proximity correction (OPC) refers to the process of biasing a reticle pattern or adding auxiliary patterns to a reticle pattern in advance based on exposure experimental data to ensure that the CD on the wafer after exposure has a target value because it is known that OPE may change the CD value. OPC is typically performed in the device manufacturer's process development phase.

Another type of correction different from OPC is OPE correction. OPE is also affected by the settings of the optical system used for exposure (such as lens aperture NA, illumination σ, and ring ratio), so that the CD value can be adjusted to a target value by adjusting the parameters of the optical system of the exposure apparatus. The adjustment described above is called OPE correction. Both the OPC and OPE correction can control the CD value; the OPC is performed in many cases during the process development phase including reticle creation, while the OPE correction is performed in many cases after reticle creation and at (immediately before) or during mass production. There is also a proximity effect, although not an optical proximity effect, represented by a micro-loading effect manifesting itself in development and other processes, and the CD is adjusted in some cases by adjusting the optical system along with an optical proximity effect.

Overlay refers to superposition of micro-patterns formed on a wafer made, for example, of a semiconductor.

A spectral linewidth $\Delta\lambda$ is an index value of a spectral linewidth that affects the exposure performance. The spectral linewidth $\Delta\lambda$ may, for example, be the bandwidth that provides laser spectrum integrated energy of 95%.

2. Overview of Exposure System According to Comparative Example

2.1 Configuration

FIG. 1 schematically shows the configuration of the exposure system according to Comparative Example. Comparative Example in the present disclosure is an aspect that the applicant is aware is known only by the applicant, and is not a publicly known example that the applicant is self-aware of. An exposure system 10 includes a laser apparatus 12 and an exposure apparatus 14. The laser apparatus 12 is a wavelength-tunable, narrow-band oscillation ArF laser apparatus and includes a laser control unit 20, a laser chamber, and a line narrowing module, the latter two of which are not shown.

The exposure apparatus 14 includes an exposure control unit 40, a beam delivery unit (BDU) 42, a highly reflective mirror 43, an illumination optical system 44, a reticle 46, a reticle stage 48, a projection optical system 50, a wafer holder 52, a wafer stage 54, and a focus sensor 58.

The wafer holder 52 holds a wafer WF. The illumination optical system 44 is an optical system that guides pulsed laser light to the reticle 46. The illumination optical system 44 shapes a laser beam into a substantially rectangular scan beam having a homogenized optical intensity distribution. The projection optical system 50 forms an image of a reticle pattern on the wafer WF. The focus sensor 58 measures the height of the wafer surface.

The exposure control unit 40 is connected to the reticle stage 48, the wafer stage 54, and the focus sensor 58. The exposure control unit 40 is connected also to the laser control unit 20. The exposure control unit 40 and the laser control unit 20 are each formed of a processor that is not shown, and each include a storage device, such as a memory. The storage device may instead be incorporated in the processor.

2.2 Operation

The exposure control unit 40 controls the movement of the wafer stage 54 in an axis-Z direction to correct the focus position in a wafer height direction (axis-Z direction) based on the height of the wafer WF measured by the focus sensor 58.

The exposure control unit 40 transmits control parameters of target laser light to the laser control unit 20 and controls the reticle stage 48 and the wafer stage 54 while transmitting a light emission trigger signal Tr to scan and expose the wafer WF with the image of the reticle 46 in a step-and-scan fashion. The control parameters of the target laser light include, for example, a target wavelength $\lambda t$ and target pulse energy Et.

The laser control unit 20 controls the wavelength selected by the line narrowing module in such a way that a wavelength $\lambda$ of the pulsed laser light outputted from the laser apparatus 12 becomes the target wavelength $\lambda t$, controls excitation intensity in such a way that pulse energy E becomes the target pulse energy Et, and causes the laser apparatus 12 to output the pulsed laser light in accordance with the light emission trigger signal Tr. The laser control unit 20 transmits a variety of measured data on the pulsed laser light outputted in accordance with the light emission trigger signal Tr to the exposure control unit 40. The variety of measured data include, for example, the wavelength $\lambda$ and the pulse energy E.

2.3 Example of Exposure Operation Performed on Wafer

Figure 2:
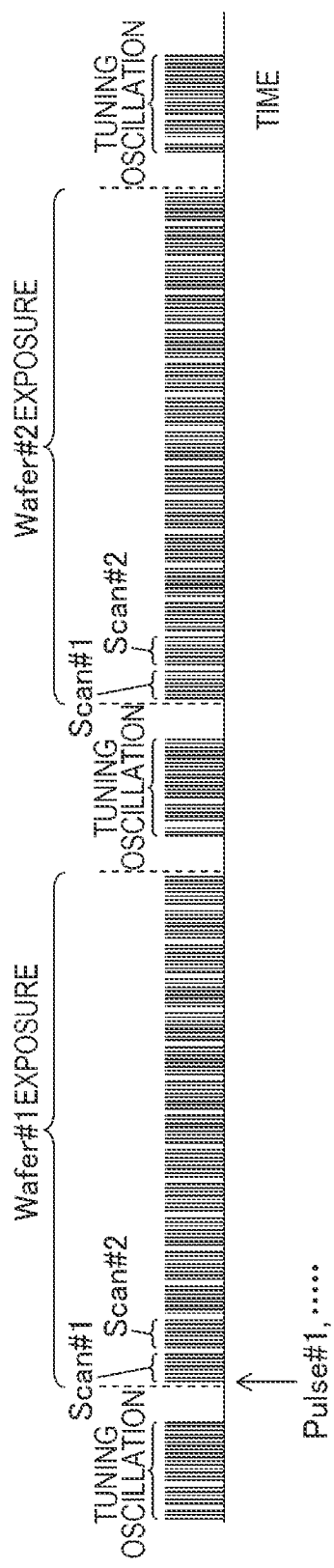
FIG. 2 shows an example of an output pattern of a light emission trigger signal transmitted from an exposure control unit to a laser control unit.

FIG. 2 shows an example of the output pattern of the light emission trigger signal Tr transmitted from the exposure control unit 40 to the laser control unit 20. In the example shown in FIG. 2, after tuning oscillation is performed for each wafer WF, an actual exposure pattern is used to perform actual exposure. That is, the laser apparatus 12 first performs the tuning oscillation, waits for a predetermined period, and performs burst operation for exposure of a first wafer (Wafer #1).

The tuning oscillation is oscillation that does not cause the pulsed laser light to be radiated to the wafer WF, but causes tuning pulsed laser light to be outputted. The tuning oscillation is performed under predetermined conditions until the laser operates in a stable exposure state, and is performed prior to a wafer production lot. Pulsed laser light Lp is outputted at a predetermined frequency ranging, for example, from about several hundred Hz to several kHz. During the wafer exposure, it is common to perform the burst operation, in which a burst period and an oscillation pause period are alternately repeated. The burst operation is performed also in the tuning oscillation.

In FIG. 2, the segments with dense pulses are each the burst period, in which the pulsed laser light is outputted continuously for a predetermined period. In FIG. 2, the segments with no pulses are each the oscillation pause period. In the tuning oscillation, the length of each of the continuous pulse output periods needs not to be fixed, but the continuous pulse output operation may be performed with the continuous pulse output periods being different from one another in length for the tuning purpose. After the tuning oscillation is performed, a relatively long period is caused to elapse, and exposure of the first wafer (Wafer #1) is performed in the exposure apparatus 14.

The laser apparatus 12 suspends the oscillation during the stepping operation in the exposure performed in the step-and-scan fashion, and outputs the pulsed laser light in accordance with the interval between the light emission trigger signals Tr during the scanning operation. Such a laser oscillation pattern is called a burst oscillation pattern.

Figure 3:
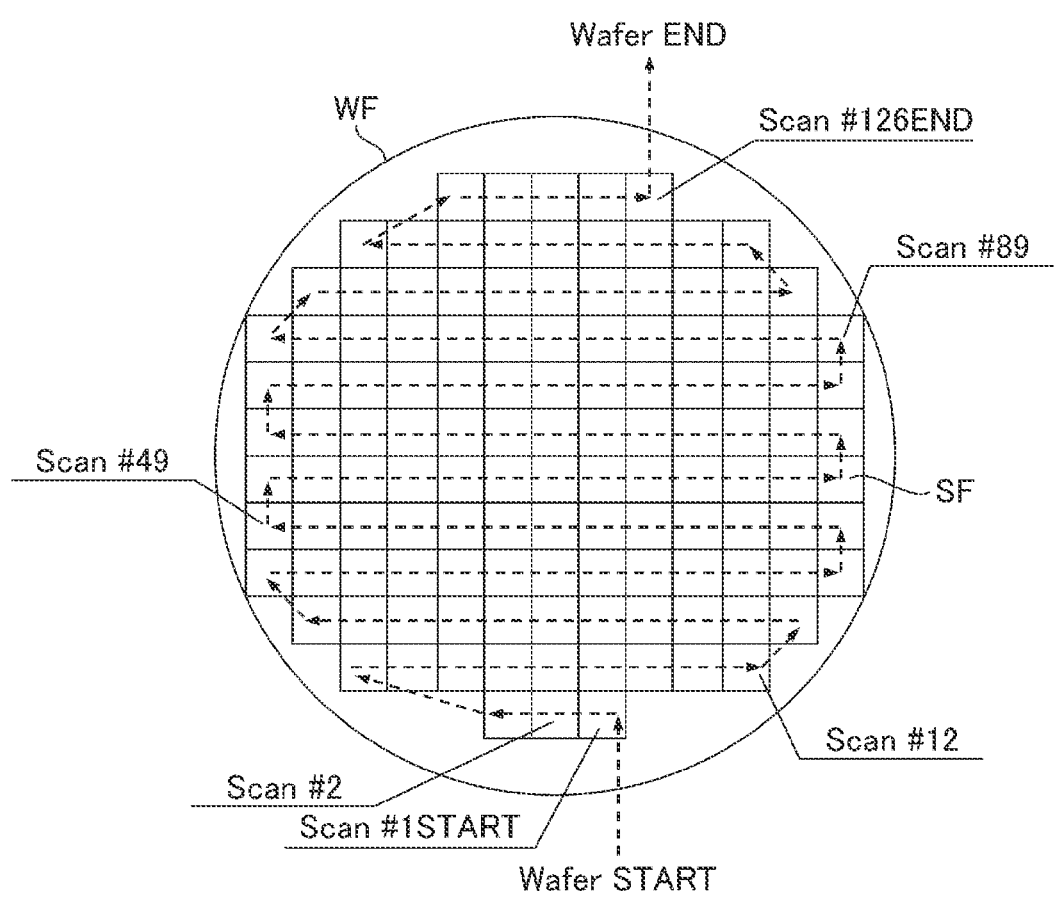
FIG. 3 shows an example of an exposure pattern in a step-and-scan exposure on a wafer.

FIG. 3 shows an example of the exposure pattern in the step-and-scan exposure on the wafer WF. A large number of rectangular regions shown in the wafer WF in FIG. 3 are each a scan field. The scan field is an exposure region where single scan exposure is performed and is also called a scan region. The wafer exposure is performed by performing the scan exposure on a plurality of exposure regions (scan fields) into which the wafer WF is divided and which each have a predetermined size during the period between the start (Wafer START) and end (Wafer END) of the wafer exposure, as shown in FIG. 3.

That is, the wafer exposure is performed by repeating the step of exposing a first predetermined exposure region of the wafer WF with first scan exposure (Scan #1) and then exposing a second predetermined exposure region with second scan exposure (Scan #2). During single scan exposure, the pulsed laser light Lp (Pulse #1, Pulse #2, . . . ) can be continuously outputted multiple times from the laser apparatus 12. After the scan exposure of the first predetermined exposure region (Scan #1) is completed, a predetermined period is caused to elapse, and scan exposure of the second predetermined exposure region (Scan #2) is performed. The scan exposure described above is successively repeated, and when the scan exposure of all the exposure regions of the first wafer WF is completed, the tuning oscillation is performed again, and the wafer exposure of a second wafer WF (Wafer #2) is performed.

The step-and-scan exposure is performed in the order indicated by the broken-line arrows shown in FIG. 3, Wafer START→Scan #1→Scan #2→ . . . →Scan #126→Wafer END. The wafer WF is an example of the "semiconductor substrate" in the present disclosure.

2.4 Relationship Between Scan Field and Static Exposure Area

Figure 4:
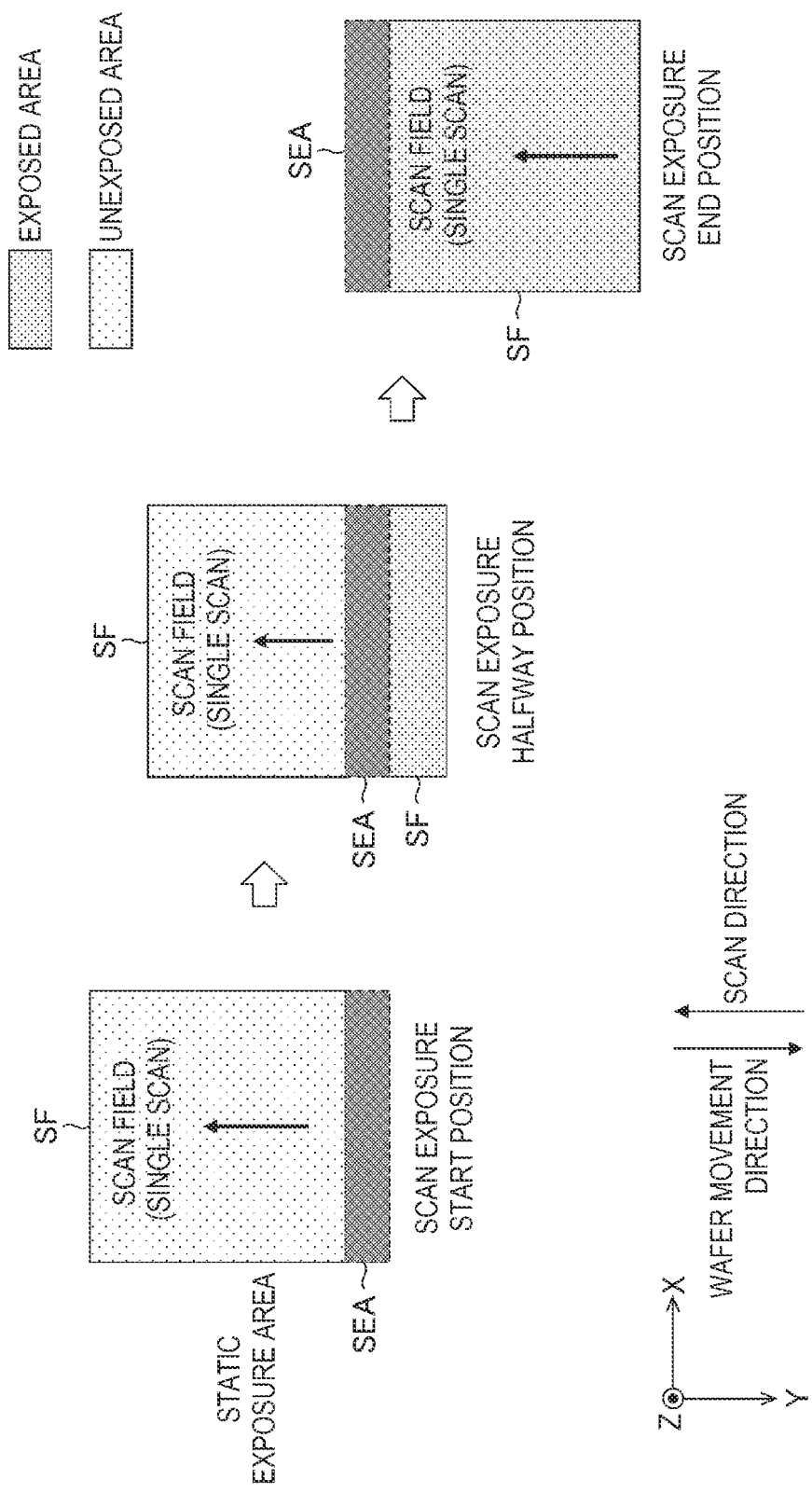
FIG. 4 shows the relationship between one scan field and a static exposure area of the wafer.

FIG. 4 shows the relationship between one scan field SF and a static exposure area SEA of the wafer WF. The static exposure area SEA is a generally rectangular, substantially uniform beam radiation region used in the scan exposure of the scan field SF. The reticle 46 is irradiated with a substantially rectangular, substantially uniform scan beam shaped by the illumination optical system 44, and the exposure is performed with the reticle 46 and the wafer WF moved along the minor axis of the scan beam (Y-axis direction in the description) in opposite directions of the Y axis in accordance with the reduction magnification of the projection optical system 50. The scan fields SF of the wafer WF are thus each scanned and exposed with the reticle pattern. The static exposure area SEA may be understood as an area that can be exposed at once to the scan beam.

In FIG. 4, the vertically upward direction toward the negative side of the Y-axis direction is a scan direction, and the direction toward the positive side of the Y-axis direction is a wafer movement direction. The direction parallel to the plane of view of FIG. 4 and perpendicular to the Y-axis direction (X-axis direction) is called a scan width direction. The size of each of the scan fields SF of the wafer WF is, for example, 33 mm in the Y-axis direction and 26 mm in the X-axis direction.

Figure 5:
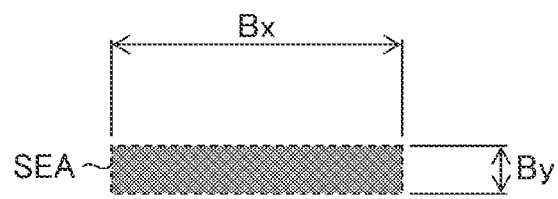
FIG. 5 describes the static exposure area.

FIG. 5 describes the static exposure area SEA. Let Bx be the X-axis-direction length of the static exposure area SEA, and By be the Y-axis-direction width of the static exposure area SEA, and Bx corresponds to the X-axis-direction size of the scan field SF, and By is sufficiently smaller than the Y-axis-direction size of the scan field SF. The Y-axis-direction width By of the static exposure area SEA is called a slit N. The number of pulses $N_{SL}$ to which a photoresist on the wafer WF is exposed is given by the expression below.

$$N_{SL}=(By/Vy)\cdot f$$

Vy: Wafer scan speed in Y-axis direction
f: Laser repetition frequency (Hz)

2.5 Problems

Figure 6:
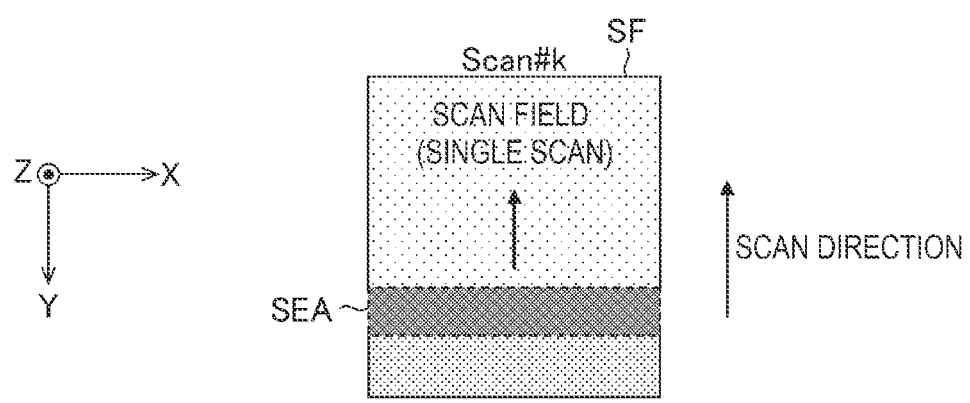
FIG. 6 is a diagrammatic view of the scan field during the scan exposure.
Figure 7:
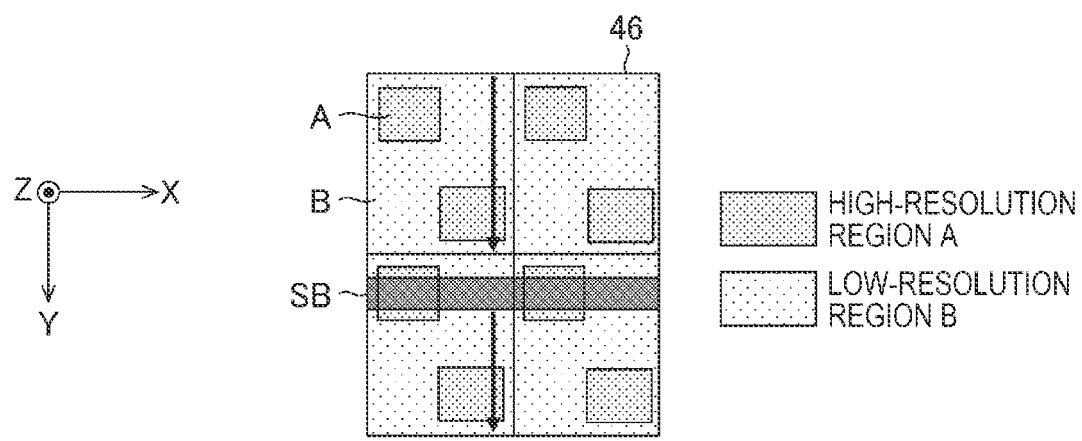
FIG. 7 is a plan view diagrammatically showing the relationship between a reticle and a scan beam and corresponding to the scan exposure operation shown in FIG. 6.

FIG. 6 is a diagrammatic view of the scan field SF during the scan exposure. FIG. 7 is a plan view diagrammatically showing the relationship between the reticle 46 and a scan beam SB and corresponding to the scan exposure operation shown in FIG. 6. FIG. 7 shows an example of the arrangement of pattern regions of the reticle 46. FIG. 7 may be understood as a diagrammatic view showing an example of a semiconductor device region pattern in one scan field SF.

The scan fields SF of each wafer WF are each, for example, a mixture of two types of region: a region for semiconductor devices that require high resolution; and a region for semiconductor devices that do not require high resolution but require a wide depth of focus. In the present specification, the region for semiconductor devices that require relatively high resolution in a scan field SF is referred to as a "high-resolution region A", and the region for semiconductor devices that do not require high resolution but require a wide depth of focus is referred to as a "low-resolution region B". The names of the high-resolution region A" and the low-resolution region B are also used for the patterns of the reticle 46. The high-resolution region A is simply called a "region A", and the low-resolution region B is simply called a "region B" in some cases.

The arrangement of the high-resolution regions A and the low-resolution regions B in a scan field SF depends on the circuit pattern design, and the high-resolution regions A and the low-resolution regions B are typically mixed with each other and arranged in the area that can be exposed at once with the scan beam SB, as shown in FIG. 7.

Since the optimal exposure conditions for the high-resolution regions A and the low-resolution regions B differ from each other, it is desirable to separately expose the high-resolution regions A and the low-resolution regions B to the scan beam SB under respective optimal conditions.

It is, however, difficult to change the exposure conditions (wavelength and spectral linewidth, for example) during single scan at high speed and with high precision, so that it is in some cases difficult to expose a pattern region of each semiconductor device to optimal pulsed laser light. Typically, the exposure conditions are changed on a scan field basis, and the exposure in one scan field SF is performed under common exposure conditions irrespective of the type of region.

Furthermore, a scan field SF has steps in the height direction of the wafer WF in some cases. In this case, the exposure is performed with the wafer stage 54 tilted by a large amount. The tilted exposure causes a significant negative impact, for example, on the overlay operation in some cases. When regions having different heights are mixed in a scan field SF, it is difficult in some cases to expose each of the regions to optimal pulsed laser light because optimal positions where the pulsed laser light is brought into focus differ among the regions having different heights.

3. First Embodiment 3.1 Overview of Lithography System
3.1.1 Configuration

Figure 8:
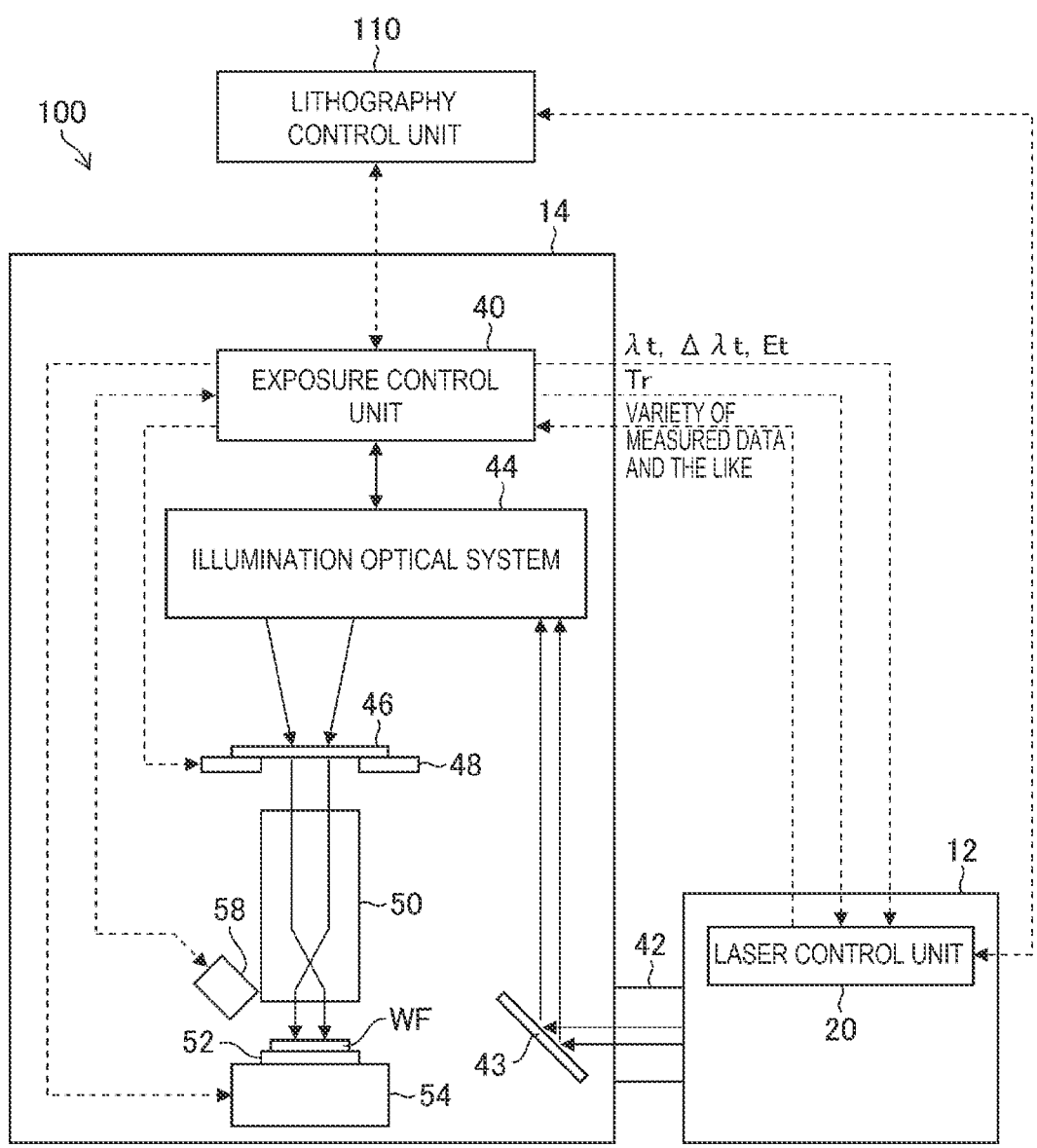
FIG. 8 shows an example of the configuration of a lithography system according to a first embodiment.

FIG. 8 shows an example of the configuration of a lithography system 100 according to a first embodiment. Differences in configuration between FIGS. 1 and 8 will be described. The lithography system 100 shown in FIG. 8 is based on the configuration shown in FIG. 1 to which a lithography control unit 110 is added, and a data transmitting/receiving line is added to and between the lithography control unit 110 and the exposure control unit 40 and to and between the lithography control unit 110 and the laser control unit 20.

The lithography system 100 includes the laser apparatus 12, the exposure apparatus 14, and the lithography control unit 110. The lithography system 100 is an example of the "exposure system" in the present disclosure. In the lithography system 100, a target spectral linewidth $\Delta\lambda t$ is added as a control parameter of the target laser light. The exposure control unit 40 transmits data on the target spectral linewidth $\Delta\lambda t$ to the laser control unit 20.

The lithography control unit 110 is formed of a processor that is not shown. The lithography control unit 110 includes a storage device such as a memory. The processor may include the storage device. A program that calculates an exposed photoresist pattern based on a pure Fourier imaging optical theory is installed in the lithography control unit 110.

The reticle pattern of the reticle 46 used in the lithography system 100 is so designed that a first pattern region in which a first pattern requiring high resolution is disposed and a second pattern region in which a second pattern requiring a wide depth of focus are disposed in positions separate from each other in the scan direction so as to each form a band-shaped region continuous in the direction perpendicular to the scan direction.

Figure 9:
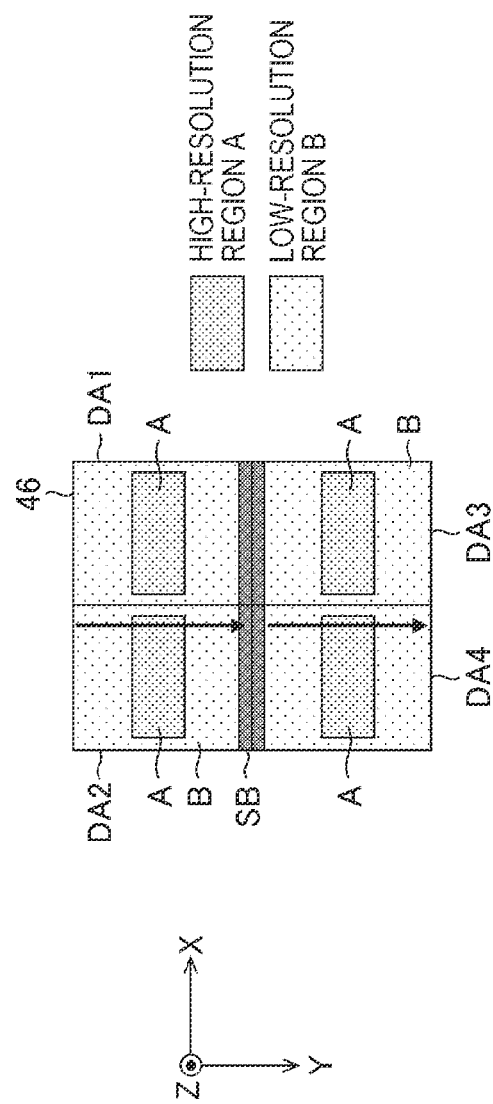
FIG. 9 is a diagrammatic view schematically showing an example of the arrangement of patterns of the reticle used in the lithography system according to the first embodiment.

FIG. 9 is a diagrammatic view schematically showing an example of the arrangement of patterns of the reticle 46 used in the lithography system 100 according to the first embodiment. The reticle 46 has a reticle pattern so designed that the high-resolution regions A and the low-resolution regions B are arranged as band-shaped regions extending along the direction (X-axis direction) perpendicular to the scan direction (Y-axis direction). That is, the reticle pattern is divided into the high-resolution regions A and the low-resolution regions B each being continuous in the X-axis direction and the band-shaped high-resolution regions A and the band-shaped low-resolution regions B are arranged in different positions in the Y-axis direction and aligned with each other in the Y-axis direction. The high-resolution regions A are each a region where the first pattern requiring high resolution is disposed (first pattern region). The low-resolution regions B are each a region where the second pattern requiring a wide depth of focus is disposed (second pattern region).

The first pattern may, for example, be a pattern representing a static random access memory (SRAM). The second pattern may, for example, be at least one of an isolated pattern, a pattern representing a logic device, and a pattern representing an amplifier. The "band-shaped" region is a region shaped so as to be continuous in the X-axis direction with the length of the Y-axis-direction region (region width) substantially fixed. The band-shaped regions in the present embodiment are each a region having a length in the X-axis direction longer than the length in the Y-axis direction. The high-resolution regions A are each an example of the "first region" in the present disclosure. The low-resolution regions B are each an example of the "second region" in the present disclosure.

The reticle surface of the reticle 46 shown in FIG. 9 is divided into 2×2 four areas, and the divided areas each (¼ area) correspond to one chip. In FIG. 9, the high-resolution region A located in an upper right first divided area DA1 and the high-resolution region A located in an upper left second divided area DA2 are arranged side by side in the X-axis direction in the same position in the Y-axis direction. In FIG. 9, the high-resolution region A located in a lower right third divided area DA3 and the high-resolution region A located in a lower left fourth divided area DA4 are arranged side by side in the X-axis direction in the same position in the Y-axis direction. The high-resolution regions A are thus disposed at the reticle surface in a concentrated manner in the band-shaped regions each continuous in the X-axis direction.

Although a low-resolution region B is disposed in some cases between two high-resolution regions A arranged side by side in the X-axis direction and/or in a very small area outside the X-axis-direction boundary (end) of a high-resolution region A, the majority of the band-shaped regions over the entire X-axis-direction length of the reticle 46 only needs to be occupied by the high-resolution regions A. For example, the total X-axis-direction length of the high-resolution regions A on a straight line along the X-axis direction is preferably at least 50% the X-axis-direction length of the reticle 46, more preferably at least 80%. The X-axis-direction length of the reticle 46 corresponds to the X-axis-direction beam width of the scan beam SB (scan beam width).

Similarly, the low-resolution regions B are disposed at the reticle surface in a concentrated manner in band-shaped regions each continuous in the X-axis direction. The total X-axis-direction length of the band-shaped low-resolution regions B on a straight line along the X-axis direction is preferably at least 50% of the X-axis-direction length of the reticle 46, more preferably at least 80%. FIG. 9 shows an example in which the X-axis-direction length of the band-shaped low-resolution regions B is 100% the X-axis-direction length of the reticle 46.

In short, the band-shaped high-resolution regions A and the band-shaped low-resolution regions B are located in different positions in the Y-axis direction, and the band-shaped high-resolution regions A and the band-shaped low-resolution regions B are unmixed (not mixed) with each other on a straight line in the X-axis direction. The term "unmixed" indicates that the band-shaped high-resolution regions A and the band-shaped low-resolution regions B do not overlap with each other in the X-axis direction. FIG. 9 shows the case where the reticle surface is divided into 2×2 four areas, but the number of areas and the shapes into which the reticle surface is divided are not limited to those in the case shown in FIG. 9.

3.1.2 Operation

The lithography control unit 110 uses a calculation program to calculate laser light control parameters optimal for each of the band-shaped high-resolution regions A and the band-shaped low-resolution regions B, and saves the results of the calculation in a file C. The control parameters saved in the file C include, for example, an optimal wavelength $\lambda b$, an optimal spectral linewidth $\Delta \lambda b$, and optimal pulse energy Eb.

The lithography control unit 110 may receive and save data on the laser apparatus 12 including the laser light control parameters from the laser control unit 20. The lithography control unit 110 receives data on the wavelength $\lambda$, the spectral linewidth $\Delta \lambda$, and the pulse energy E from the laser control unit 20 and saves the data.

The exposure control unit 40 reads the values of the laser light control parameters corresponding to each of the regions A and B in a scan field SF of the wafer WF from the file C in the lithography control unit 110.

The exposure control unit 40 transmits the values of the laser light control parameters on a pulse basis to the laser apparatus 12 when the regions A and B are each exposed to the laser light. The values of the control parameters transmitted from the exposure control unit 40 to the laser apparatus 12 may, for example, be the target wavelength $\lambda t$, the target spectral linewidth $\Delta \lambda t$, and the target pulse energy Et. The subsequent exposure operations are the same as those performed by the exposure system 10 in FIG. 1.

3.2 Example of Laser Apparatus 3.2.1 Configuration

Figure 10:
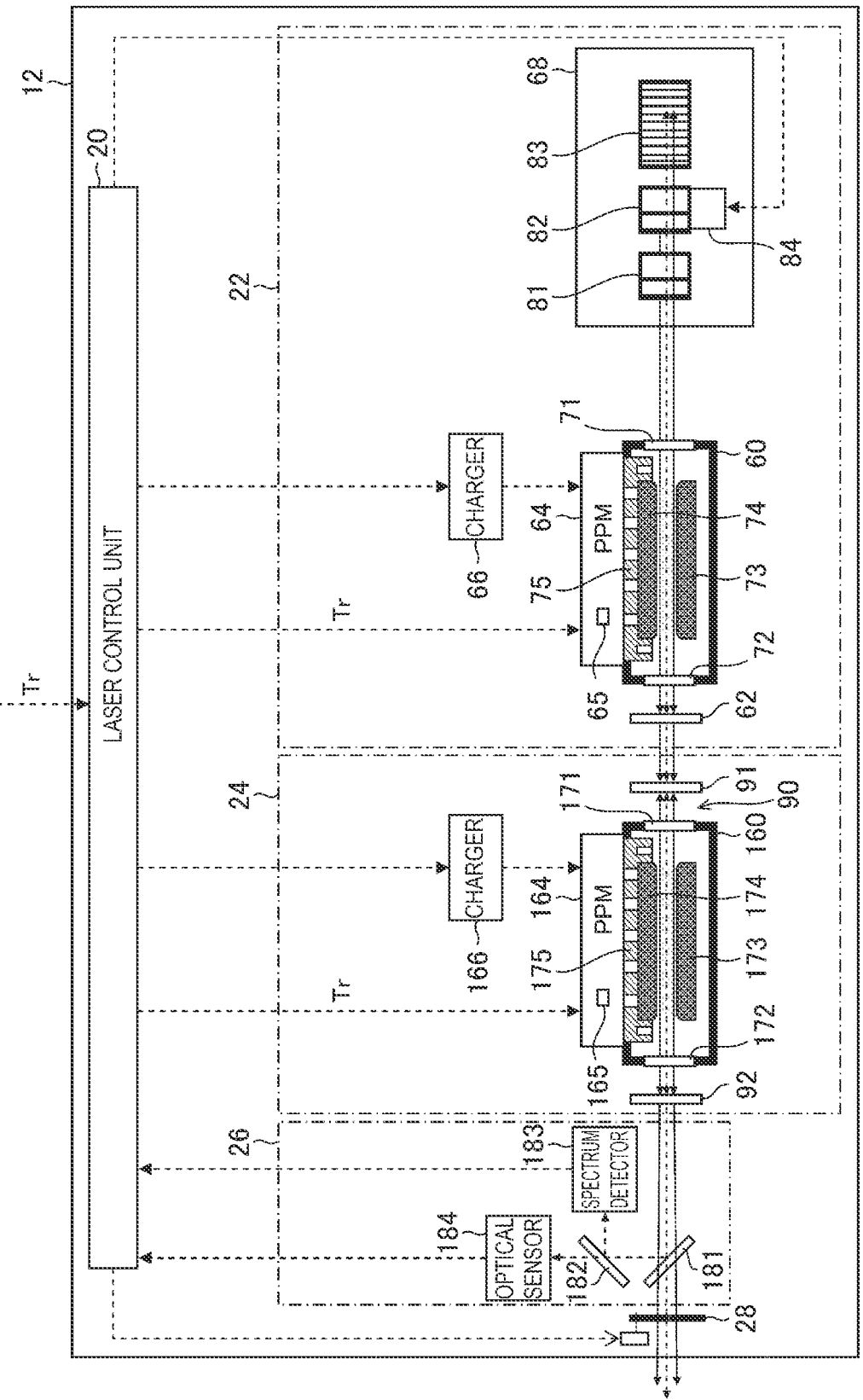
FIG. 10 shows an example of the configuration of a laser apparatus.

FIG. 10 shows an example of the configuration of the laser apparatus 12. The laser apparatus 12 shown in FIG. 10 is a narrowed-line ArF laser apparatus and includes the laser control unit 20, an oscillator 22, an amplifier 24, a monitor module 26, and a shutter 28. The oscillator 22 includes a chamber 60, an output coupling mirror 62, a pulse power module (PPM) 64, a charger 66, and a line narrowing module (LNM) 68.

The chamber 60 includes windows 71 and 72, a pair of electrodes 73 and 74, and an electrically insulating member 75. The PPM 64 includes a switch 65 and a charging capacitor that is not shown and is connected to the electrode 74 via feedthroughs in the electrically insulating member 75. The electrode 73 is connected to the chamber 60, which is grounded. The charger 66 charges the charging capacitor of the PPM64 in accordance with an instruction from the laser control unit 20.

The line narrowing module 68 and the output coupling mirror 62 form an optical resonator. The chamber 60 is so disposed that the discharge region between the pair of electrodes 73 and 74 is located in the optical path of the resonator. The output coupling mirror 62 is coated with a multilayer film that reflects a portion of the laser light generated in the chamber 60 and transmits the other portion of the laser light.

The line narrowing module 68 includes two prisms 81 and 82, a grating 83, and a rotary stage 84, which rotates the prism 82. The line narrowing module 68 controls the oscillation wavelength of the pulsed laser light by rotating the prism 82 with the aid of the rotary stage 84 to change the angle of incidence of the pulsed laser light to be incident on the grating 83. The rotary stage 84 may be a rotary stage including a piezoelectric device capable of responding so quick that the rotary stage 84 responds to individual pulses.

The amplifier 24 includes an optical resonator 90, a chamber 160, a PPM 164, and a charger 166. The configurations of the chamber 160, the PPM 164, and the charger 166 are the same as those of the corresponding elements of the oscillator 22. The chamber 160 includes windows 171 and 172, a pair of electrodes 173 and 174, and an electrically insulating member 175. The PPM 164 includes a switch 165 and a charging capacitor that is not shown.

The optical resonator 90 is a Fabry-Perot-type optical resonator and is formed of a rear mirror 91 and an output coupling mirror 92. The rear mirror 91 reflects a portion of the laser light and transmits the other portion thereof. The output coupling mirror 92 reflects a portion of the laser light and transmits the other portion thereof. The rear mirror 91 has reflectance ranging, for example, from 80% to 90%. The output coupling mirror 92 has reflectance ranging, for example, from 10% to 30%.

The monitor module 26 includes beam splitters 181 and 182, a spectrum detector 183, and an optical sensor 184, which detects the pulse energy of the laser light. The spectrum detector 183 may, for example, be an etalon spectrometer. The optical sensor 184 may, for example, be a photodiode.

3.2.2 Operation

When the laser control unit 20 receives the data on the target wavelength $\lambda t$, the target spectral linewidth $\Delta \lambda t$, and the target pulse energy Et from the exposure control unit 40, the laser control unit 20 controls the rotary stage 84 of the LNM 68 in such a way that the output wavelength becomes the target wavelength $\lambda t$, a scheme described later in such a way that the target spectral linewidth $\lambda \Delta t$ is achieved, and at least the charger 166 of the amplifier 24 in such a way that the target pulse energy Et is achieved.

When the laser control unit 20 receives the light emission trigger signal Tr from the exposure control unit 40, the laser control unit 20 provides the switch 165 of the PPM 164 and the switch 65 of the PPM 64 with trigger signals, so that the pulsed laser light outputted from the oscillator 22 discharges when entering the discharge space in the chamber 160 of the amplifier 24. As a result, the amplifier 24 amplifies the pulsed laser light outputted from the oscillator 22 and causes the amplified pulsed laser light to oscillate. The amplified pulsed laser light is sampled by the beam splitter 181 of the monitor module 26, and the pulse energy E, the wavelength $\lambda$, and the spectral linewidth $\Delta \lambda$ are measured.

The laser control unit 20 acquires data on the pulse energy E and the wavelength $\lambda$ measured with the monitor module 26, and controls the charging voltage applied to the charger 166 and the oscillation wavelength at which the oscillator 22 oscillates in such a way that the difference between the pulse energy E and the target pulse energy Et, the difference between the wavelength $\lambda$ and the target wavelength $\lambda t$, and the difference between the spectral linewidth $\Delta \lambda$ and the target spectral linewidth $\Delta \lambda t$ all approach zero.

The laser control unit 20 can control the pulse energy E, the wavelength $\lambda$, and the spectral linewidth $\Delta \lambda$ on a pulse basis. The spectral linewidth $\Delta \lambda$ of the pulsed laser light outputted from the laser apparatus 12 can be controlled by controlling a delay period $\Delta t$ by which the discharge timing in the chamber 60 of the oscillator 22 and the chamber 160 of the amplifier 24 is delayed.

The pulsed laser light having passed through the beam splitter 181 of the monitor module 26 enters the exposure apparatus 14 via the shutter 28.

3.2.3 Others

FIG. 10 shows the case where a Fabry-Perot resonator is used as the optical resonator 90, and the optical resonator 90 may instead be an amplifier with a ring resonator.

Figure 11:
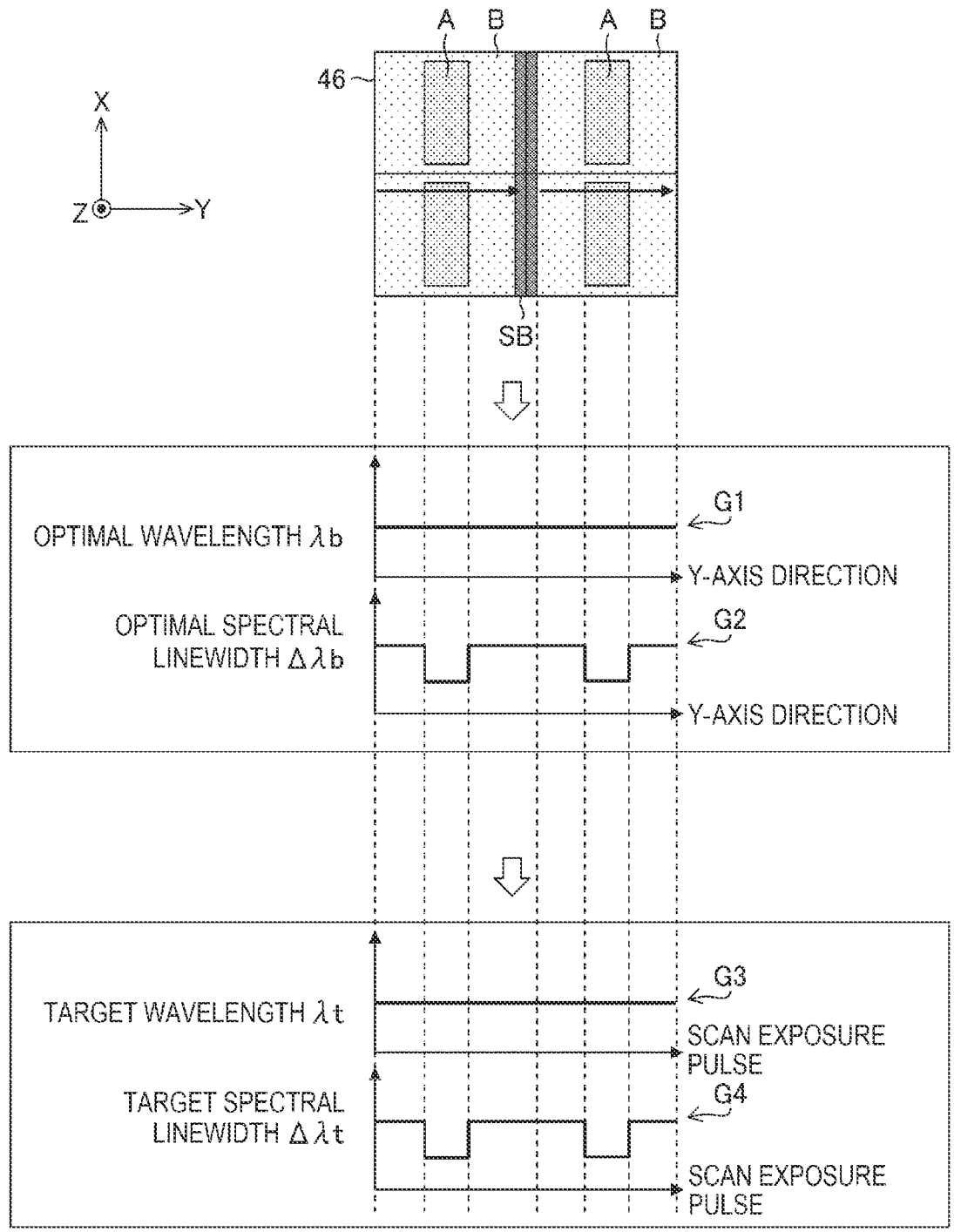
FIG. 11 shows a band-shaped reticle pattern and an example of a trend of values of target laser light control parameters.

3.3 Band-Shaped Reticle Pattern and Example of Trend of Values of Target Laser Light Control Parameters FIG. 11 shows an example of the relationship between the band-shaped reticle pattern and the values of the target laser light control parameters. The upper portion of FIG. 11 diagrammatically shows that the scan beam SB scans the band-shaped reticle pattern and moves in the Y-axis direction thereof. Graphs G1 and G2 are shown in the frame in the middle portion of FIG. 11, the graph G1 showing the relationship between the direction-Y position in single scan and the optimal wavelength $\lambda b$, the graph G2 showing the relationship between the direction-Y position in single scan and the optimal spectral linewidth $\Delta\lambda b$. Graphs G3 and G4 are shown in the frame in the lower portion of FIG. 11, the graph G3 showing the target wavelength $\lambda t$ for each scan exposure pulse corresponding to the direction-Y position in single scan, the graph G4 showing the target spectral linewidth $\Delta\lambda t$ for each scan exposure pulse corresponding to the direction-Y position in single scan.

The example shown in FIG. 11 shows a case where the exposure control unit 40 reads the data in the file C created by the lithography control unit 110, uses the values of the optimal wavelength $\lambda b$ and the optimal spectral linewidth $\Delta\lambda b$ for each of the high-resolution regions A and the low-resolution regions B, and transmits the values as they are to the laser control unit 20 as the target wavelength $\lambda t$ and the target spectral linewidth $\Delta\lambda t$.

Figures 12, 13:
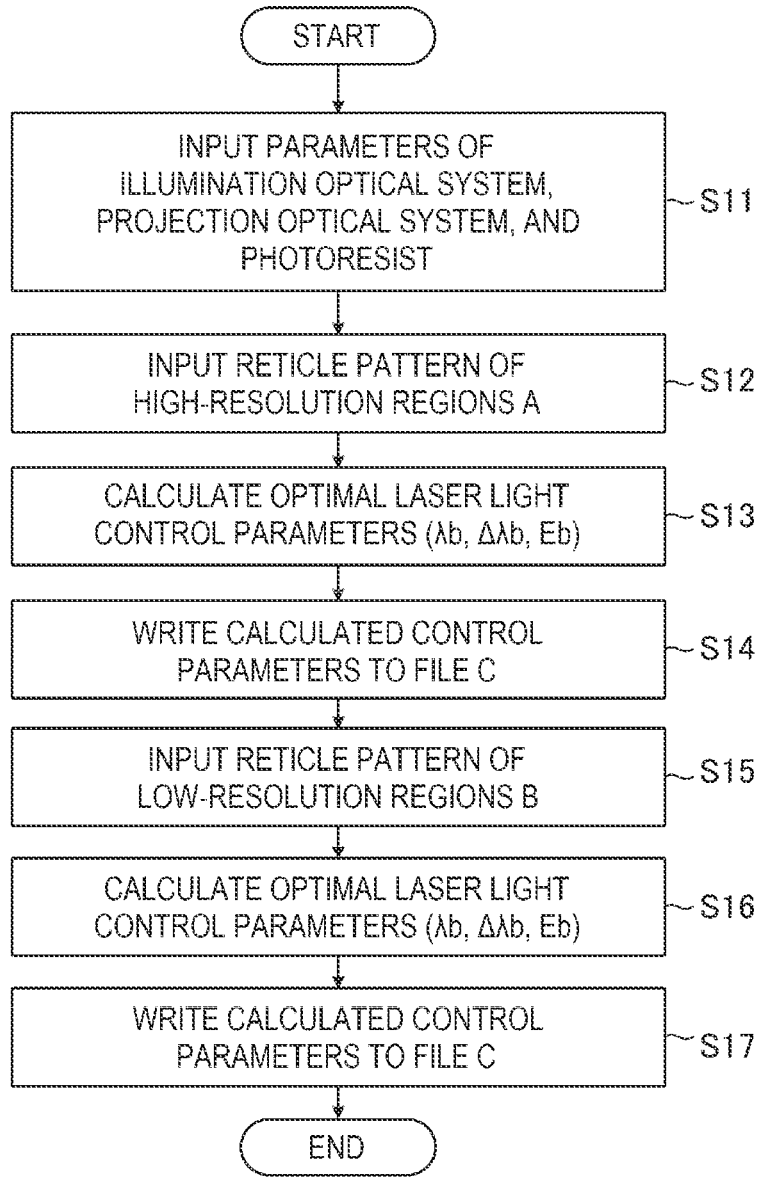
FIG. 12 is a flowchart showing an example of processes carried out by a lithography control unit in the first embodiment.
FIG. 13 is a conceptual diagram showing an example of the data structure of a table saved in a file C.

3.4 Example of Contents of Processes Carried Out by Lithography Control Unit FIG. 12 is a flowchart showing an example of processes carried out by the lithography control unit 110 in the first embodiment. The steps shown in FIG. 12 are achieved by a program executed by a processor that functions as the lithography control unit 110.

In step S11, the lithography control unit 110 accepts input of data on parameters of the illumination optical system 44, the projection optical system 50, and the photoresist.

The parameters of the illumination optical system 44 include, for example, the $\sigma$ value and the illumination shape. The parameters of the projection optical system 50 include, for example, lens data and the numerical aperture (NA) of each lens. The parameters of the photoresist include, for example, the sensitivity.

In step S12, the lithography control unit 110 accepts input of pattern information on the reticle pattern of the high-resolution regions A. The pattern information includes information on the shape of the patterns of the high-resolution regions A, the pattern arrangement, the spacing between the patterns, the positions of the high-resolution regions A, and other factors, and the pattern information includes at least position information on the boundary positions of the high-resolution regions A.

In step S13, the lithography control unit 110 calculates laser light control parameters optimal for the high-resolution regions A. The control parameters include, for example, the optimal wavelength $\lambda b$, the optimal spectral linewidth $\Delta\lambda b$, and the optimal pulse energy Eb.

In step S14, the lithography control unit 110 writes the control parameter values obtained by the calculation performed in step S13 to the file C.

In step S15, the lithography control unit 110 accepts input of pattern information on the reticle pattern of the low-resolution regions B. The pattern information includes information on the shape of the patterns of the low-resolution regions B, the pattern arrangement, the spacing between the patterns, the positions of the low-resolution regions B, and other factors, and the pattern information includes at least position information on the boundary positions of the low-resolution regions B.

In step S16, the lithography control unit 110 calculates laser light control parameters optimal for the low-resolution regions B.

In step S17, the lithography control unit 110 writes the control parameters obtained by the calculation performed in step S16 to the file C.

After step S17, the lithography control unit 110 terminates the flowchart of FIG. 12.

FIG. 13 is a conceptual diagram showing an example of the data structure of a table saved in the file C. Data on the parameters of the optimal wavelength $\lambda b$, the optimal spectral linewidth $\Delta\lambda b$, and the optimal pulse energy Eb are written for each of the regions of the reticle 46 to the file C. The data on the parameters are associated with the regions, as shown in the table in FIG. 13.

3.5 Example of Contents of Processes Carried Out by Exposure Control Unit

Figure 14:
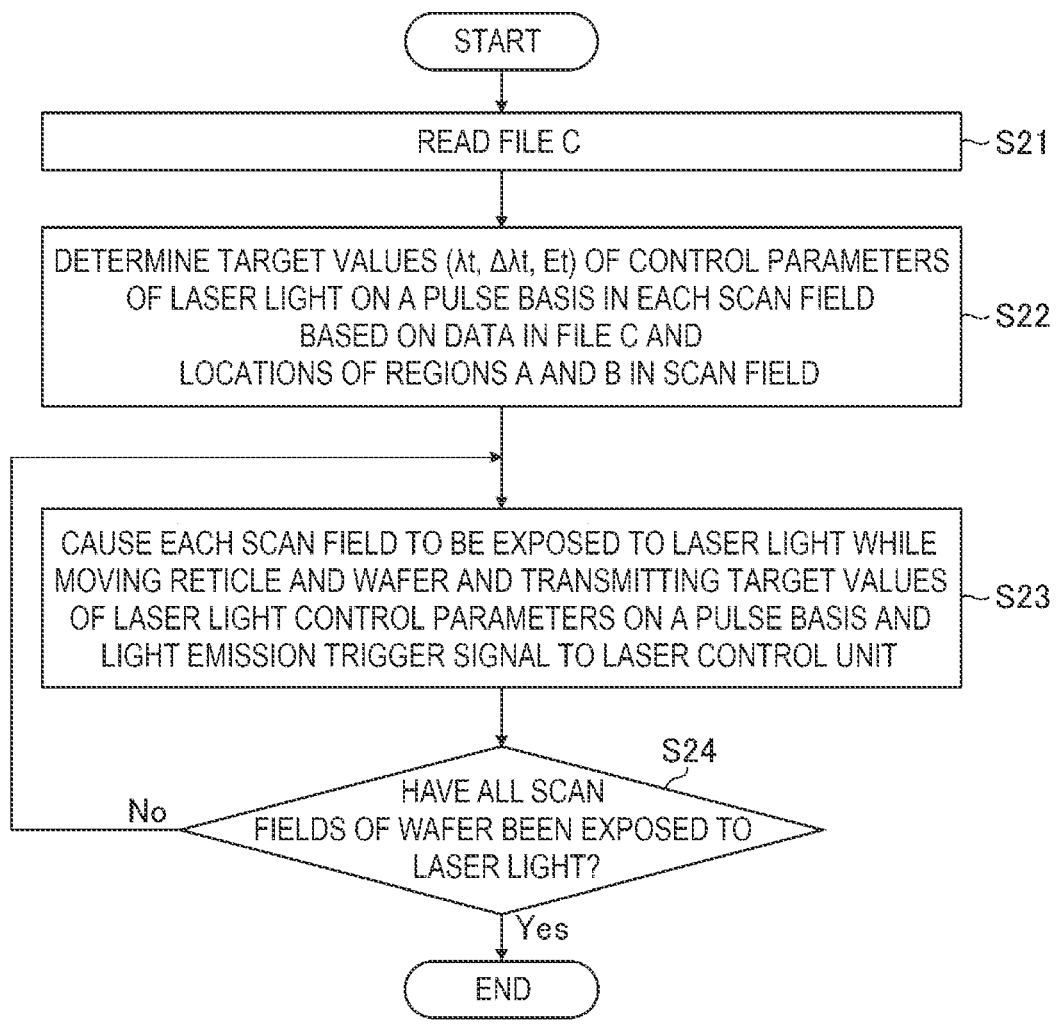
FIG. 14 is a flowchart showing an example of processes carried out by an exposure control unit in the first embodiment.

FIG. 14 is a flowchart showing an example of processes carried out by the exposure control unit 40 in the first embodiment. The steps shown in FIG. 14 are achieved by a program executed by a processor that functions as the exposure control unit 40.

In step S21, the exposure control unit 40 reads the data in the file C saved in the lithography control unit 110.

In step S22, the exposure control unit 40 determines the target values ($\lambda t$, $\Delta\lambda t$, Et) of the control parameters of the laser light on a pulse basis in each scan field based on the data in the file C and the locations of the regions A and B in the scan field SF. That is, the exposure control unit 40 controls the laser apparatus 12 to irradiate the regions A with first pulsed laser light by setting a first target wavelength, a first target spectral linewidth, and first target pulse energy of the pulsed laser light according to the regions A. The exposure control unit 40 further controls the laser apparatus 12 to irradiate the regions B with second pulsed laser light by setting a second target wavelength, a second target spectral linewidth, and second target pulse energy of the pulsed laser light according to the regions B. The exposure control unit 40 controls the laser light control parameters on a pulse basis.

In step S23, the exposure control unit 40 causes each scan field SF to be exposed to the laser light while moving the reticle 46 and the wafer WF and transmitting the target values of the laser light control parameter on a pulse basis and the light emission trigger signal Tr to the laser control unit 20.

In step S24, the exposure control unit 40 evaluates whether or not all the scan fields SF of the wafer WF have been exposed to the laser light. When the result of the evaluation in step S24 is No, the exposure control unit 40 returns to step S23. When the result of the evaluation in step S24 is Yes, the exposure control unit 40 terminates the flowchart of FIG. 14.

3.6 Example of Contents of Processes Carried Out by Laser Control Unit

Figure 15:
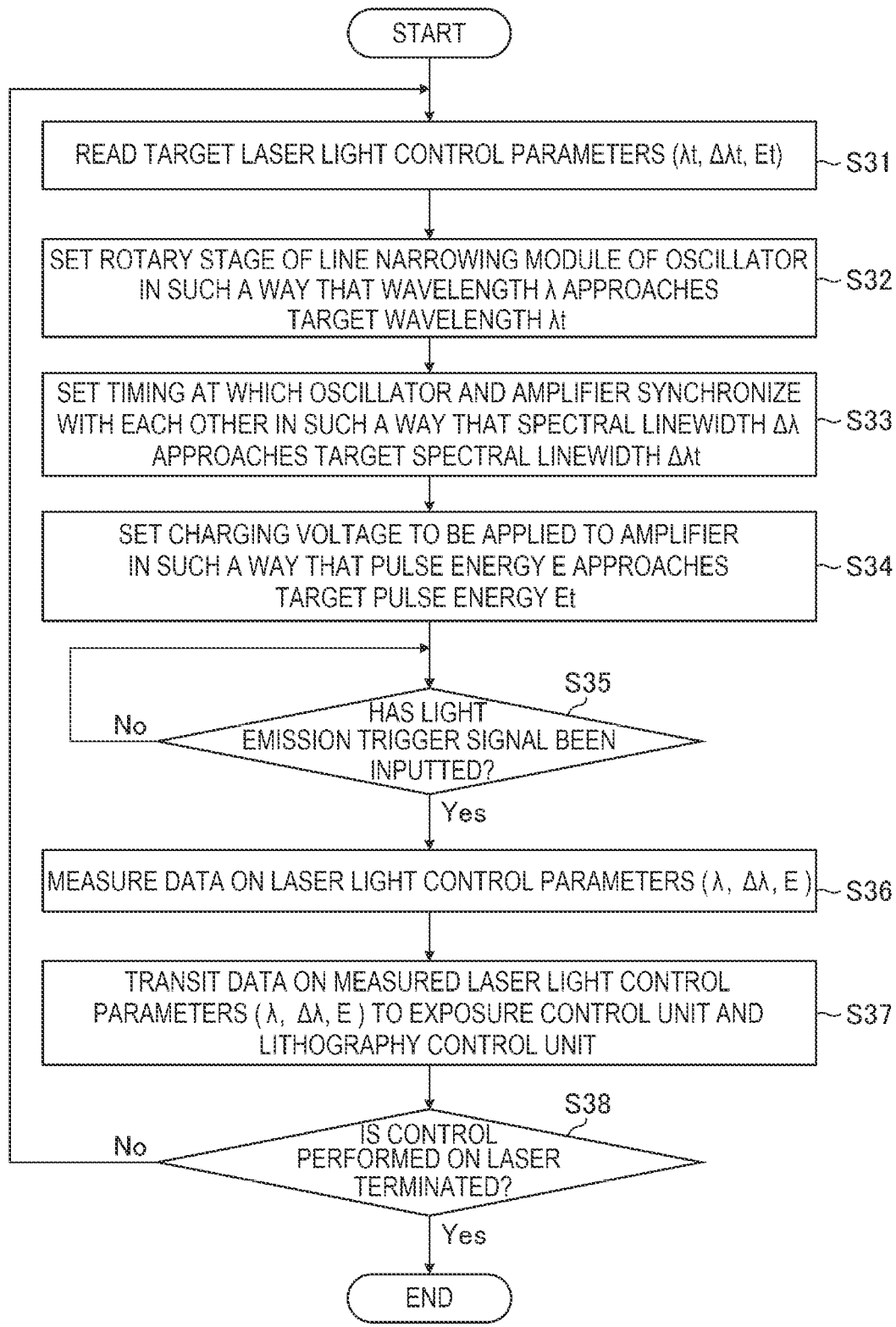
FIG. 15 is a flowchart showing an example of processes carried out by a laser control unit in the first embodiment.

FIG. 15 is a flowchart showing an example of processes carried out by the laser control unit 20 in the first embodiment. The steps shown in FIG. 15 are achieved by a program executed by a processor that functions as the laser control unit 20.

In step S31, the laser control unit 20 reads the data on the target laser light control parameters ($\lambda t$, $\Delta\lambda t$, Et) transmitted from the exposure control unit 40.

In step S32, the laser control unit 20 sets the rotary stage 84 of the line narrowing module 68 of the oscillator 22 in such a way that the wavelength of the pulsed laser light outputted from the laser apparatus 12 approaches the target wavelength $\lambda t$.

In step S33, the laser control unit 20 sets the timing at which the oscillator 22 and the amplifier 24 synchronize with each other in such a way that the spectral linewidth $\Delta\lambda$ of the pulsed laser light outputted from the laser apparatus 12 approaches the target spectral linewidth $\Delta\lambda t$.

In step S34, the laser control unit 20 sets the charging voltage to be applied to the amplifier 24 in such a way that the pulse energy approaches the target pulse energy Et.

In step S35, the laser control unit 20 waits for the input of the light emission trigger signal Tr and evaluates whether or not the light emission trigger signal has been inputted. When the light emission trigger signal Tr has not been inputted, the laser control unit 20 repeats step S35, and when the light emission trigger signal Tr has been inputted, the laser control unit 20 proceeds to step S36.

In step S36, the laser control unit 20 uses the monitor module 26 to measure the data on the laser light control parameters. The laser control unit 20 acquires data on the wavelength $\lambda$, the spectral linewidth $\Delta\lambda$, and the pulse energy E through the measurement in step S36.

In step S37, the laser control unit 20 transmits the data on the laser light control parameters measured in step S36 to the exposure control unit 40 and the lithography control unit 110.

In step S38, the laser control unit 20 evaluates whether or not the control performed on the laser is terminated. When the result of the evaluation in step S38 is No, the laser control unit 20 returns to step S31. When the result of the evaluation in step S38 is Yes, the laser control unit 20 terminates the flowchart of FIG. 15.

3.7 Effects and Advantages

The lithography system 100 according to the first embodiment provides the following effects.

[1] A reticle pattern for forming identical (same type of) semiconductor devices is placed in the form of a band in the direction perpendicular to the scan direction, and the laser light control parameters are changed in accordance with the position of the band-shaped region in a scan field in a semiconductor process. The scan exposure using laser light optimal for the band-shaped reticle pattern can thus be performed on a pulse basis.

[2] As a result, the performance and yield of the manufactured semiconductor devices are improved.

[3] In the scan field, the laser light control parameters corresponding to OPE optimal for the pattern in each area are determined and used in the exposure on a pulse basis, whereby the OPE characteristics depending on the scan position can be quickly adjusted.

3.8 Others

The first embodiment has been described with reference to the case where the functions of the lithography control unit 110 and the exposure control unit 40 are separated from each other, but not necessarily, and the function of the lithography control unit 110 may be provided by the exposure control unit 40.

The calculation procedure shown in FIG. 12 may be executed in advance by a computer in which the calculation program is installed, and the file C shown in FIG. 13 may be saved in a storage section of the lithography control unit 110 or the exposure control unit 40. The lithography control unit 110 may be a server that manages the variety of parameters used in the scan exposure. The server may be connected to a plurality of exposure systems via a network. For example, the server executes the calculation procedure shown in FIG. 12 and writes the calculated control parameter values to the file C with the control parameter values associated with the band-shaped regions.

Furthermore, in the first embodiment, the optimal wavelength $\lambda b$, the optimal spectral linewidth $\Delta\lambda b$, and the optimal pulse energy Eb for each of the regions A and B are determined by optical simulation calculation to create the file C, but not necessarily. For example, test exposure may be performed with the laser light control parameters changed, and based on the result of the test exposure, optimal laser light control parameters for each of the regions may be saved in the file C.

4. Second Embodiment 4.1 Configuration

The configuration of the lithography system according to a second embodiment may be the same as that in the first embodiment.

4.2 Operation

Figure 16:
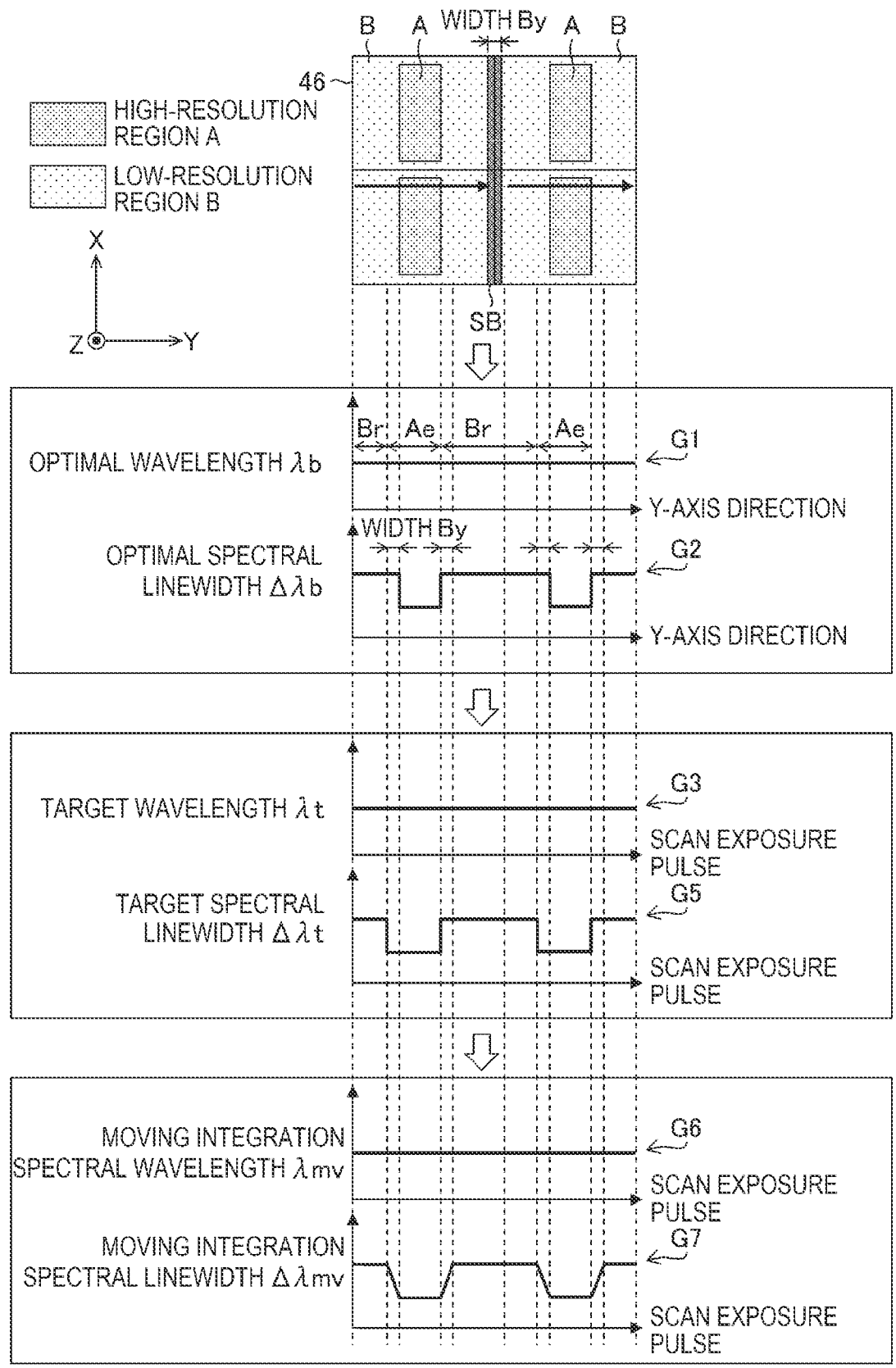
FIG. 16 shows a band-shaped reticle pattern and an example of a trend of values of target laser light control parameters in a lithography system according to a second embodiment.

FIG. 16 shows the band-shaped reticle pattern and an example of a trend of the values of the target laser light control parameters in the lithography system according to the second embodiment. Differences between FIGS. 11 and 16 will be described. In FIG. 16, the graph G4 in FIG. 11 is replaced with a graph G5.

Provided that the direction of movement of the scan beam SB relative to the reticle 46 is the positive direction of the Y axis, the high-resolution regions A and the low-resolution regions B are each disposed in the form of a band extending along the X-axis direction (scan width direction) perpendicular to the direction of movement of the scan beam SB at the reticle surface.

Compared with the graph G4 in FIG. 11, the graph G5 is so changed that the timing at which the value of the target spectral linewidth $\Delta\lambda t$ is switched is earlier by the Y-axis-direction beam width (width By) of the scan beam SB on the negative (upstream) side from the Y-axis-direction-negative-side boundary position of each of the high-resolution regions A. The change is equivalent to setting the target spectral linewidth $\Delta\lambda t$ (A) for an imaginary enlarged region Ae, which is the region A having an enlarged boundary region starting from the Y-axis-direction-negative-side boundary position of the region A and extending by the band-shaped region having the width By toward the negative side of the Y-axis direction. The scan beam SB with which the reticle 46 is illuminated becomes, on the wafer WF, a scan beam having a size according to the magnification of the projection optical system 50 of the exposure apparatus 14. For example, when the magnification of the projection optical system 50 is ¼×, the size of the scan beam on the wafer WF is ¼ the size of the scan beam SB with which the reticle 46 is illuminated. The scan field area of the scan field SF on the wafer WF is ¼ the scan field area of the scan field SF on the reticle 46. The Y-axis-direction beam width (width By) of the scan beam SB with which the reticle 46 is illuminated is the beam width that achieves the Y-axis-direction width By of the static exposure area SEA of the wafer WF.

Graphs G6 and G7 are shown in the frame in the bottom portion of FIG. 16, the graph G6 showing a moving integration spectral wavelength λmv for each scan exposure pulse corresponding to the direction-Y position in single scan, the graph G7 showing a moving integration spectral linewidth Δλmv for each scan exposure pulse. The moving integration spectral wavelength λmv and the moving integration spectral linewidth Δλmv are the center wavelength and spectral linewidth, respectively, determined from the waveform of a moving integration spectrum. The moving integration spectrum waveform is a spectrum waveform produced by as a result of moving integration of a spectrum waveform for the number of pulses $N_{SL}$ to which the photoresist on the wafer WF is exposed.

When the target spectral linewidth Δλt is set as indicated by the graph G5, the moving integration spectral linewidth Δλmv becomes that indicated by the graph G7, and the target spectral linewidth Δλt approaches Δλb and the moving integration spectral linewidth Δλmv becomes constant over the range of each of the high-resolution regions A.

Figure 17:
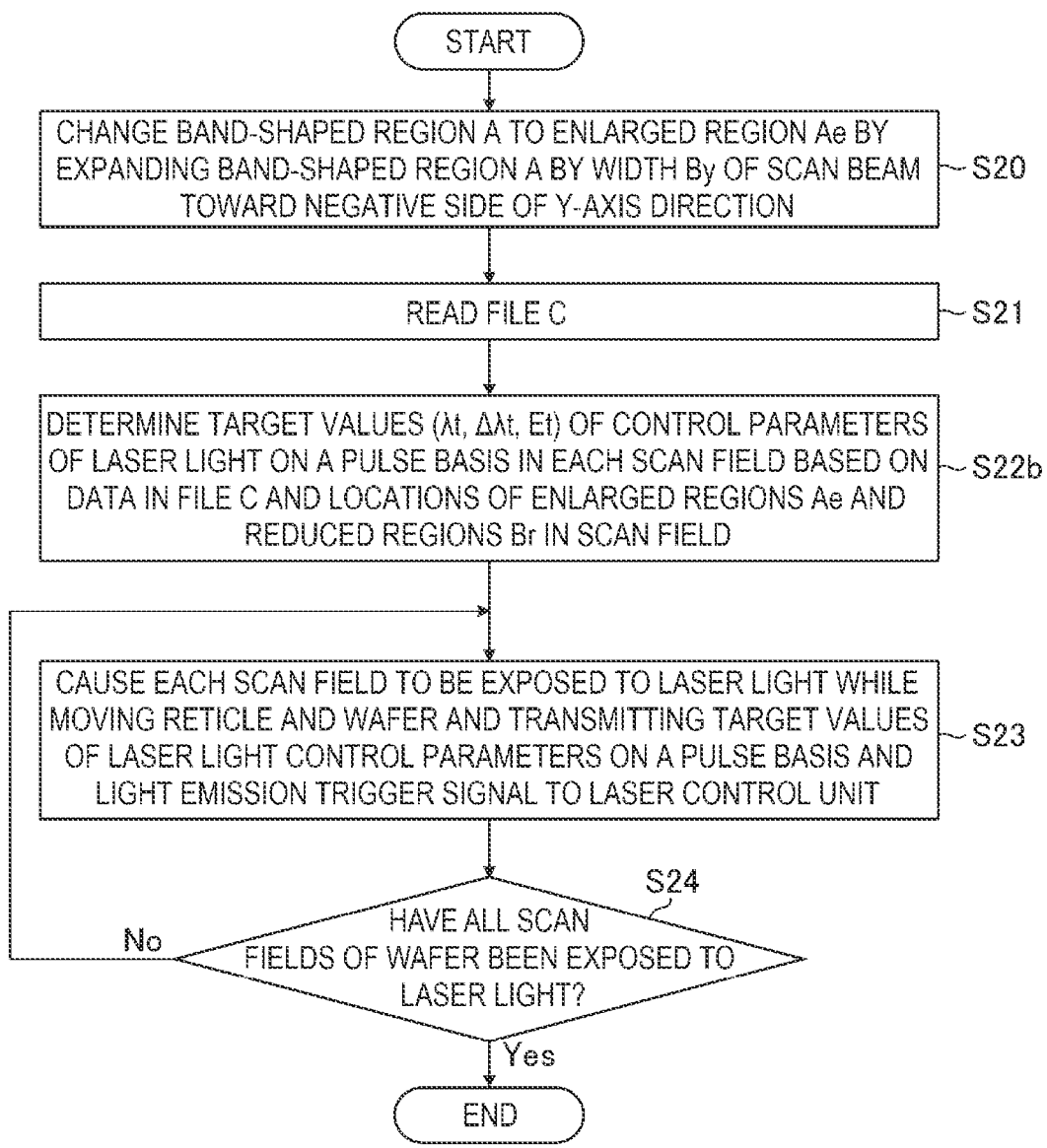
FIG. 17 is a flowchart showing an example of processes carried out by an exposure control unit in the second embodiment.

FIG. 17 is a flowchart showing an example of processes carried out by the exposure control unit 40 in the second embodiment. Differences in flowchart between FIGS. 14 and 17 will be described. The flowchart shown in FIG. 17 includes an additional step S20 before step S21, and step S22b in place of step S22 in FIG. 14.

In step S20, the exposure control unit 40 changes the band-shaped region A to the enlarged region Ae by moving the Y-axis-direction-negative-side boundary position of the region A in such a way that the range of the region A is enlarged by the beam width (width By) of the scan beam SB toward the negative side of the Y-axis direction, as shown in FIG. 6.

In response to the change from the region A to the enlarged region Ae, the Y-axis-direction-positive-side boundary position of the region B adjacent to the enlarged region Ae on the negative side of the Y-axis direction is changed, so that the region B becomes an imaginary reduced region Br, as shown in FIG. 6. That is, the Y-axis-direction-positive-side boundary position of the band-shaped region B moves by the width By toward the negative side of the Y-axis direction, and the range of the region B is reduced and changed to the reduced region Br. The Y-axis-direction-negative-side boundary position of the region B adjacent to the Y-axis-direction positive side of the region A does not need to be changed.

In step S22b, the exposure control unit 40 calculates the target values (λt, Δλt, Et) of the laser light control parameters on a pulse basis in each scan field SF based on the data in the file C and the locations of the enlarged regions Ae and the reduced regions Br in the scan field SF. The following steps are the same as those in the flowchart of FIG. 14.

4.3 Effects and Advantages

The spectrum waveform of the pulsed laser light to which a scan field SF is exposed is a value provided by the moving integration for the number of exposure pulses $N_{SL}$. According to the second embodiment, the exposure can be at least performed with the optimal spectral linewidth Δλb as the spectral linewidth Δλ of the pulsed laser light with which the high-resolution regions A are irradiated.

4.4 Variation

Figure 18:
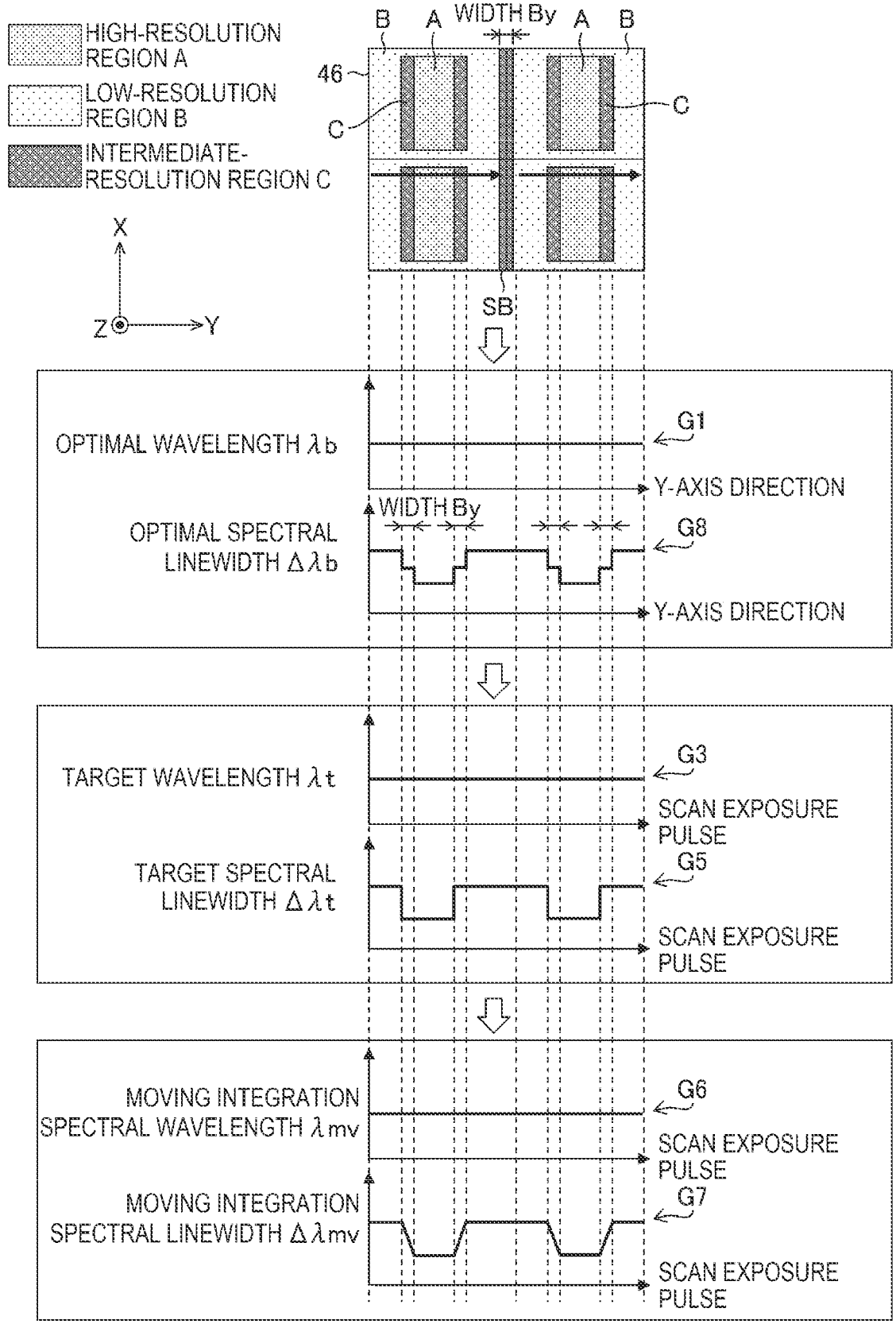
FIG. 18 shows a band-shaped reticle pattern and an example of a trend of values of target laser light control parameters in a lithography system according to a variation of the second embodiment.

FIG. 18 shows the band-shaped reticle pattern and an example of a trend of the values of the target laser light control parameters in the lithography system according to a variation of the second embodiment. Differences of the variation of the second embodiment shown in FIG. 18 from the second embodiment shown in FIG. 16 will be described.

In FIG. 18, the same element as that in FIG. 16 has the same reference character, and no redundant description of the same element will be made. In FIG. 16, an example of the arrangement of two types of regions, the regions A and B, has been described, and in the variation shown in FIG. 18, band-shaped intermediate resolution regions C are disposed between the high-resolution regions A and the low-resolution regions B. The intermediate resolution regions C are each a pattern region that requires resolution substantially intermediate between the resolution required for the high-resolution regions A and the resolution required for the low-resolution regions B. The intermediate resolution regions C are each referred to as a "region C" in some cases. In correspondence with the arrangement pattern of the band-shaped regions A to C described above, the optimal spectral linewidth Δλb is expressed by a graph G8. On the other hand, the target spectral linewidth Δλt may be set as shown by the graph G5.

When the scan beam SB scans the reticle 46 and moves thereacross, the regions of the reticle 46 are exposed to the scan beam SB in the following order: the low-resolution region B→the intermediate resolution region C→the high-resolution region A. The moving integration spectral linewidth Δλmv is therefore expressed by the graph G7. The band-shaped intermediate resolution regions C are disposed in the regions where the moving integration spectral linewidth Δλmv changes, as shown in FIG. 18. Also, in the variation shown in FIG. 18, the exposure can be performed with a spectral linewidth optimal for the high-resolution regions A. The intermediate resolution regions C are an example of the "third region" in the present disclosure, and a circuit pattern located in each of the intermediate resolution regions C is an example of the "third pattern" in the present disclosure.

5. Third Embodiment 5.1 Configuration

The configuration of the lithography system according to a third embodiment may be the same as that in the first embodiment.

To manufacture electronic devices, such as memory systems and CMOS (complementary metal oxide semiconductor) image sensors, a primary section, such as a memory cell section and a pixel section, is typically disposed in a central portion of the chip in many cases. Peripheral circuits, a measurement mark pattern, a test pattern, a monitoring pattern, and the like are disposed around the primary section.

In the lithography system according to the third embodiment, the reticle pattern is so designed that the pattern region of the primary section (main pattern region) and the pattern region of the peripheral circuit section (peripheral circuit region) are disposed in different positions in the Y-axis direction in the form of band-shaped regions extending in the direction (X-axis direction) perpendicular to the scan direction based on the same concept of the reticle pattern configuration described in the first and second embodiments. That is, the measurement mark pattern, the test pattern, and the monitoring pattern are disposed as much as possible in positions where the patterns overlap in the X-axis direction with the primary section, such as the memory cell section and the pixel section, and the peripheral circuits are disposed as much as possible in positions where the peripheral circuits do not overlap with the primary section in the X-axis direction.

Figure 19:
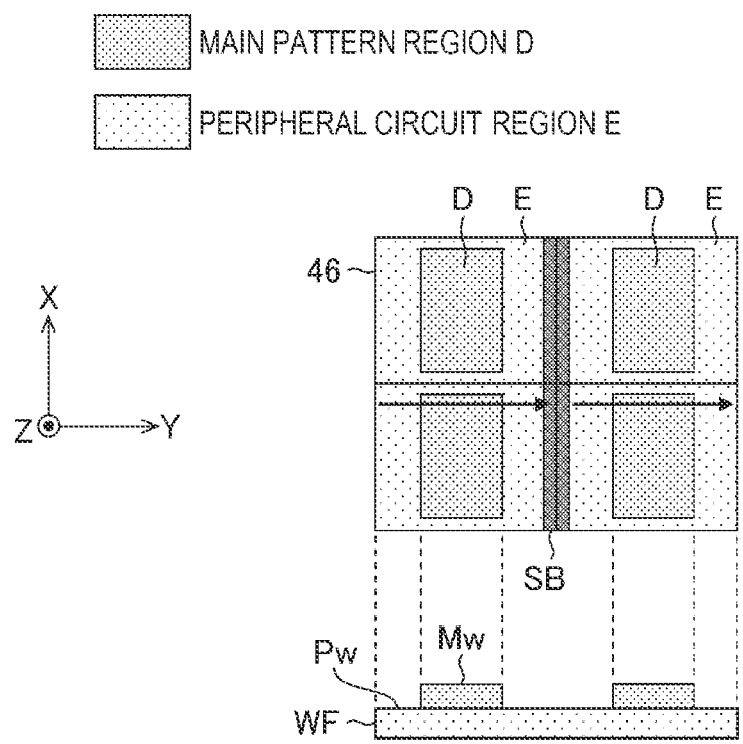
FIG. 19 diagrammatically shows a relationship applied to a lithography system according to a third embodiment between a reticle pattern and regions of the wafer.

FIG. 19 diagrammatically shows the relationship applied to the lithography system according to the third embodiment between the reticle pattern and the regions of the wafer WF. The upper portion of FIG. 19 is a plan view of the reticle 46, and the lower portion of FIG. 19 is a cross-sectional view of a region of the wafer WF, the region corresponding to the reticle 46. In the example shown in FIG. 19, the reticle 46 corresponding to one scan field is divided into four areas, and the divided areas each correspond to the circuit pattern of one chip.

The reticle 46 has main pattern regions D and peripheral circuit regions E, as shown in FIG. 19. The main pattern regions D are each a primary region where the pattern of a primary section Mw, such as the memory cell section and the pixel section, is disposed. The peripheral circuit regions E are each the region where the patterns of peripheral circuits and other components associated with the primary section Mw are disposed. The arrangement of the main pattern regions D and the peripheral circuit regions E may be the same as the arrangement of the high-resolution regions A and the low-resolution regions B in the first embodiment.

Figure 20:
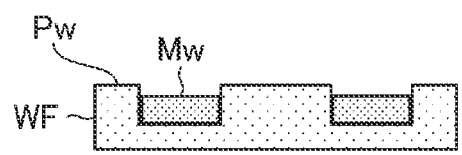
FIG. 20 is a cross-sectional view diagrammatically showing another example of the cross section of the wafer.

In the third embodiment, there is a step (height difference) in the plane of the wafer WF between a region of each of the primary sections Mw on the wafer WF, the region corresponding to the main pattern region D, and a region of each of peripheral circuit sections Pw on the wafer WF, the region corresponding to the peripheral circuit region E. FIG. 19 shows a configuration in which the primary section Mw is higher than the peripheral circuit section Pw by way of example, but not necessarily, and the primary section Mw may be lower than the peripheral circuit section Pw, as shown in FIG. 20. The main pattern region D is simply described as a "region D", and the peripheral circuit region E is simply described as a "region E" in some cases. The region of each of the primary sections Mw of the wafer WF is an example of the "first height region" in the present disclosure. The region of each of the peripheral circuit sections Pw is an example of the "second height region" in the present disclosure.

Figure 21:
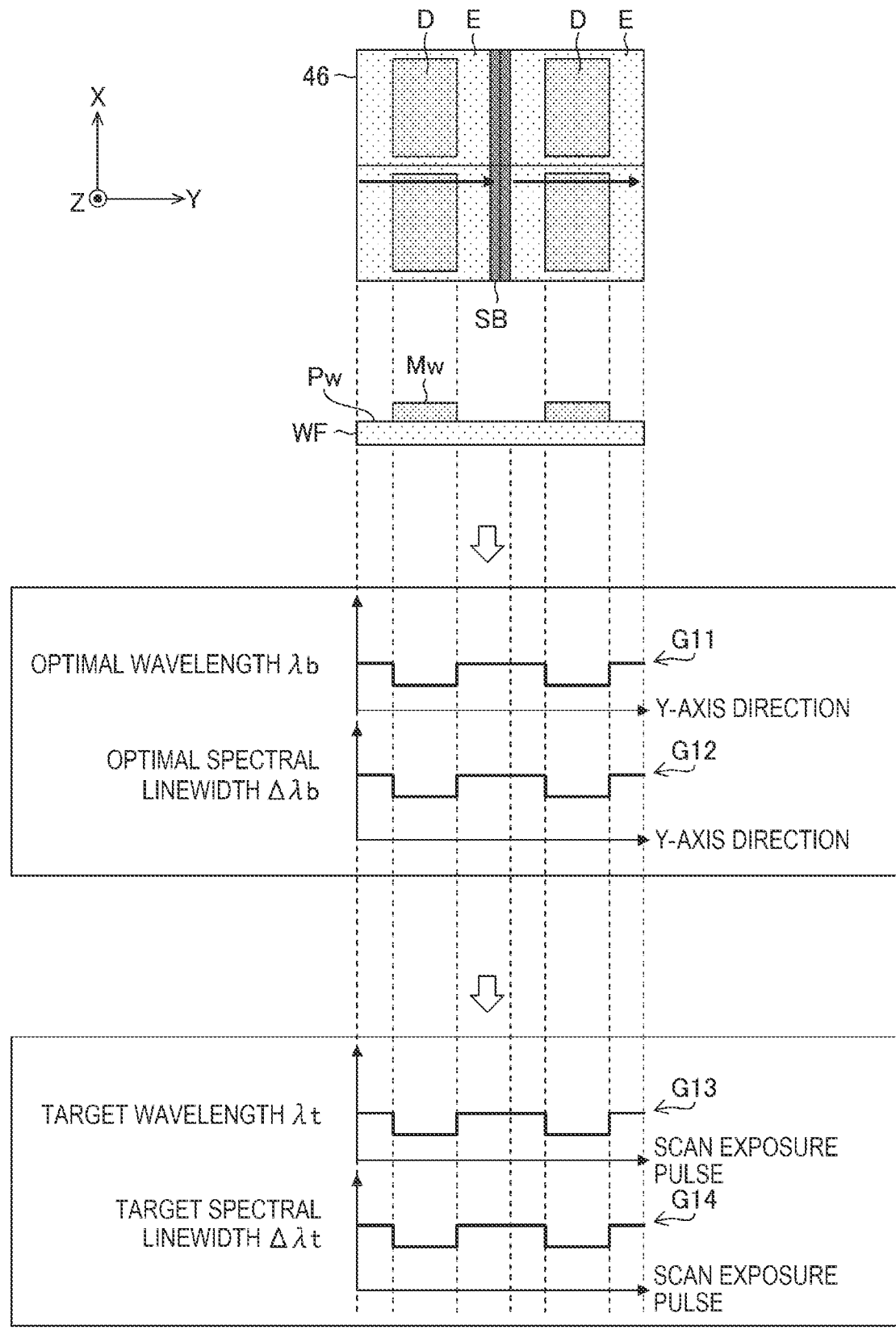
FIG. 21 shows the band-shaped reticle pattern and an example of a trend of the values of the target laser light control parameters in the lithography system according to the third embodiment.

FIG. 21 shows the band-shaped reticle pattern and an example of a trend of the values of the target laser light control parameters in the lithography system according to the third embodiment. Differences between FIGS. 11 and 21 will be described. The upper portion of FIG. 21 is a cross-sectional view of the reticle pattern and the wafer WF described with reference to FIG. 19. Graphs G11 and G12 are shown in the frame in the middle portion of FIG. 21, the graph G11 showing the relationship between the direction-Y position in single scan and the optimal wavelength λb, the graph G12 showing the relationship between the direction-Y position in single scan and the optimal spectral linewidth Δλb.

Graphs G13 and G14 are shown in the frame in the lower portion of FIG. 21, the graph G13 showing the target wavelength λt for each scan exposure pulse corresponding to the direction-Y position in single scan, the graph G14 showing the target spectral linewidth Δλt for each scan exposure pulse corresponding to the direction-Y position in single scan.

The example shown in FIG. 21 shows a case where the exposure control unit 40 reads the data in a file C3 created by the lithography control unit 110, uses the values of the optimal wavelength λb and the optimal spectral linewidth Δλb for each of the main pattern regions D and the peripheral circuit regions E, and transmits the values as they are to the laser control unit 20 as the target wavelength λt and the target spectral linewidth Δλt.

5.2 Operation

The exposure control unit 40 of the lithography system according to the third embodiment changes the center wavelength of the pulsed laser light in accordance with the step between the primary section Mw and the peripheral circuit section Pw on the wafer WF.

The exposure control unit 40 calculates the wavelength λb and the spectral linewidth Δλb optimal for each band-shaped region extending in the direction perpendicular to the scan direction based, for example, on a required depth of focus, the position where the pulsed laser light is brought into focus, and a required resolution in accordance with the step of the wafer WF. The exposure control unit 40 calculates the target wavelength λt and the target spectral linewidth Δλt on a pulse basis in each scan field from the optimal wavelength λb and the optimal spectral linewidth Δλb.

The exposure control unit 40 transmits the control parameter values (target wavelength λt, target spectral linewidth Δλt, and target pulse energy Et) of the laser light on a pulse basis to the laser control unit 20 in a step-and-scan fashion.

The laser control unit 20 controls the laser apparatus 12 in such a way that the target values of the control parameters are achieved on a pulse basis and outputs pulsed laser light in accordance with the light emission trigger signal Tr.

The exposure control unit 40 controls the reticle stage 48 and the wafer stage 54 to scan and expose the wafer WF with the image of the reticle 46 while transmitting the light emission trigger signal Tr.

5.3 Example of Contents of Processes Carried Out by Lithography Control Unit

FIG. 22 is a flowchart showing an example of processes carried out by the lithography control unit 110 in the third embodiment. Differences in flowchart between FIGS. 12 and 22 will be described. The flowchart shown in FIG. 22 includes steps S12c, S14c, S15c, and S17c in place of steps S12, S14, S15, and S17 in FIG. 12.

In step S12c, the lithography control unit 110 accepts input of pattern information on the reticle pattern of each of the main pattern regions D and a laser light focus position F(D). The laser light focus position F (D) is determined in accordance with the height position (position Z) of the primary sections Mw on the wafer WF (see FIGS. 19 and 20).

In step S13, the lithography control unit 110 calculates the laser light control parameters optimal for the main pattern regions D.

Thereafter, in step S14c, the lithography control unit 110 writes the control parameters obtained by the calculation in step S13 to the file C3.

In step S15c, the lithography control unit 110 accepts input of the pattern information on the reticle pattern of each of the peripheral circuit regions E and a laser light focus position F(E). The laser light focus position F(E) is determined in accordance with the height position (position Z) of the peripheral circuit sections Pw on the wafer WF (see FIGS. 19 and 20).

In step S16, the lithography control unit 110 calculates laser light control parameters optimal for the peripheral circuit regions E.

In step S17c, the lithography control unit 110 writes the control parameter obtained by the calculation in step S16 to the file C3.

After step S17c, the lithography control unit 110 terminates the flowchart of FIG. 22.

FIG. 23 is a conceptual diagram showing the data structure of a table saved in the file C3. Data on the parameters of the laser light focus position, the optimal wavelength λb, the optimal spectral linewidth Δλb, and the optimal pulse energy Eb are written to the file C3 for each of the regions of the reticle 46.

5.4 Example of Contents of Processes Carried Out by Exposure Control Unit

Figure 24:
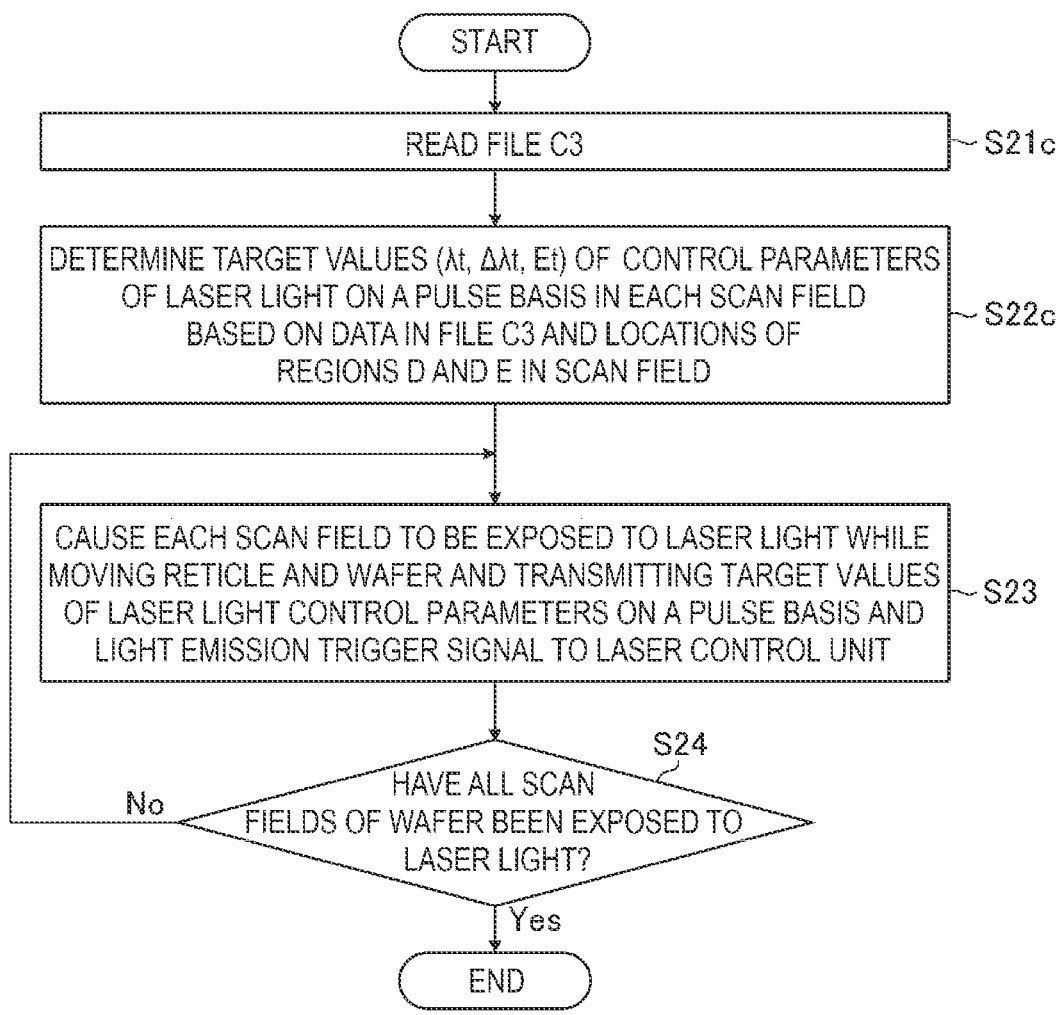
FIG. 24 is a flowchart showing an example of processes carried out by the exposure control unit in the third embodiment.

FIG. 24 is a flowchart showing an example of processes carried out by the exposure control unit 40 in the third embodiment. Differences in flowchart between FIGS. 14 and 24 will be described. The flowchart shown in FIG. 24 includes steps S21c and S22c in place of steps S21 and S22 in FIG. 14.

In step S21c, the exposure control unit 40 reads the data in the file C3 saved in the lithography control unit 110.

In step S22c, the exposure control unit 40 determines the target values (λt, Δλt, Et) of the laser light control parameters on a pulse basis in each scan field based on the data in the file C3 and the locations of the regions D and E in the scan field. The following steps are the same as those in the flowchart of FIG. 14.

5.5 Effects and Advantages

The lithography system according to the third embodiment allows, even when electronic devices, such as memory systems and CMOS image sensors, are manufactured, scan exposure on each of the main pattern regions D and the peripheral circuit regions E with laser light control parameters optimal for the region by arranging the main pattern regions D and the peripheral circuit regions E in the form of bands in the direction perpendicular to the scan direction.

As a result, the performance and yield of the manufactured semiconductor devices are improved.

5.6 Others

The third embodiment has been described with reference to the case where the functions of the lithography control unit 110 and the exposure control unit 40 are separated from each other, but not necessarily, and the function of the lithography control unit 110 may be provided by the exposure control unit 40.

The calculation procedure shown in FIG. 22 may be executed in advance by a computer in which the calculation program is installed, and the file C3 shown in FIG. 23 may be saved in a storage device of the lithography control unit 110 or the exposure control unit 40.

Furthermore, in the third embodiment, the optimal wavelength λb, the optimal spectral linewidth Δλb, and the optimal pulse energy Eb for each of the regions D and E are determined by optical simulation calculation to create the file C3, but not necessarily. For example, test exposure may be performed with the laser light control parameters changed, and based on the result of the test exposure, optimal laser light control parameters for each of the regions may be saved in the file C3.

6. Fourth Embodiment

6.1 Configuration

The configuration of the lithography system according to a fourth embodiment may be the same as that in the first embodiment.

6.2 Operation

Figure 25:
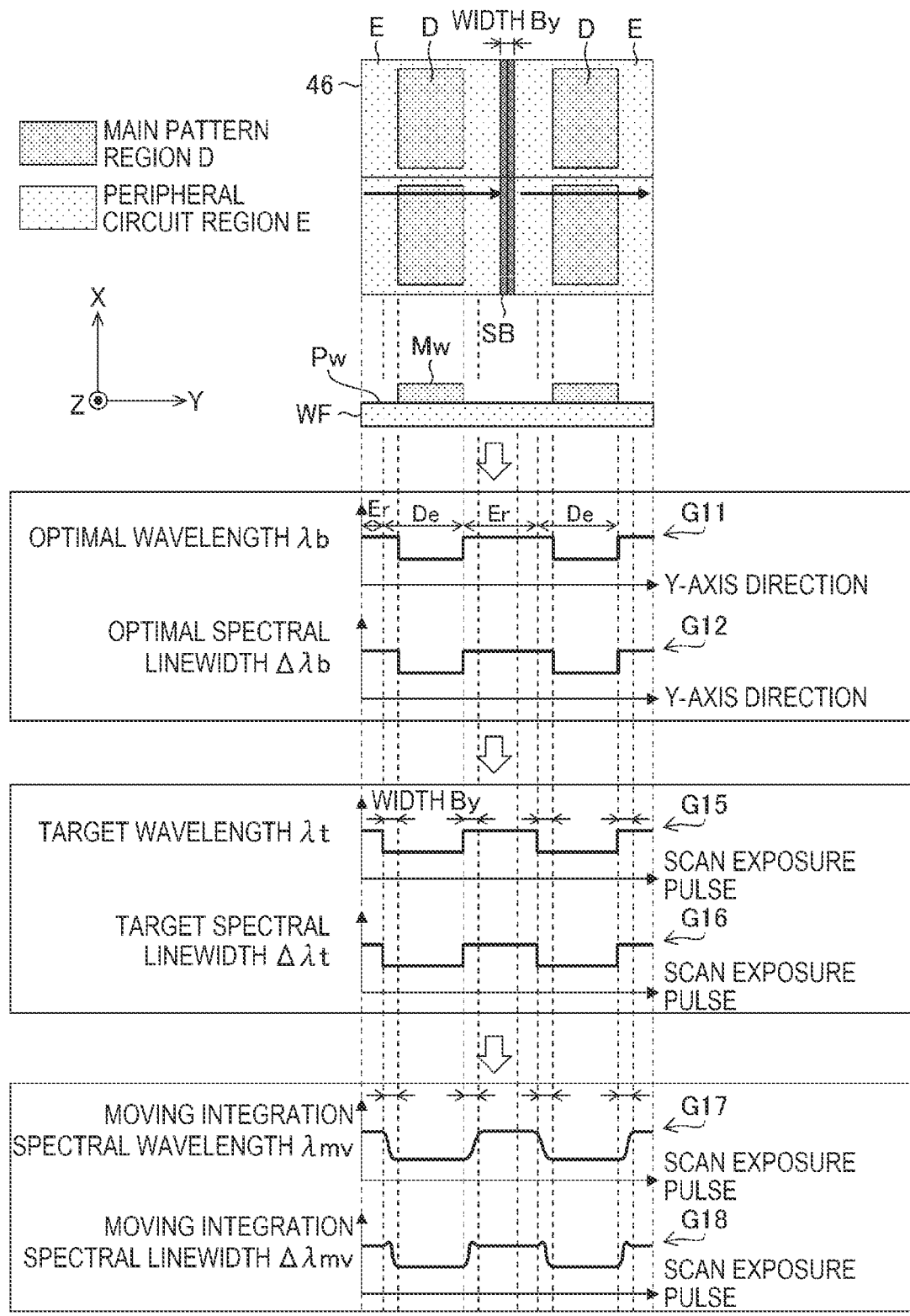
FIG. 25 shows the band-shaped reticle pattern and an example of a trend of values of target laser light control parameters in the lithography system according to a fourth embodiment.

FIG. 25 shows the band-shaped reticle pattern and an example of a trend of the values of the target laser light control parameters in the lithography system according to the fourth embodiment. Differences between the examples shown in FIGS. 21 and 25 will be described. In FIG. 25, the graphs G13 and G14 in FIG. 21 are replaced with graphs G15 and G16.

Compared with the graph G13 in FIG. 21, the graph G15 is so changed that the timing at which the value of the target spectral linewidth Δλt is switched is earlier by the Y-axis-direction beam width (width By) of the scan beam SB on the negative (upstream) side from the Y-axis-direction-negative-side boundary position of each of the main pattern regions D. The change means setting the target wavelength λt(D) and the target spectral linewidth Δλt(D) for an imaginary enlarged region De, which is the region D having an enlarged boundary region starting from the Y-axis-direction-negative-side boundary position of the region D and extending by the band-shaped region having the width By toward the negative side of the Y-axis direction.

In response to the change from the region D to the enlarged region De, the Y-axis-direction-positive-side boundary position of the region E conversely moves by the width By toward the negative side of the Y-axis direction, so that the region E is reduced and changed to an imaginary reduced region Er, as shown in FIG. 25. The target wavelength λt(E) and the target spectral linewidth Δλt(E) are then set for the reduced region Er.

Graphs G17 and G18 are shown in the frame in the bottom portion of FIG. 25, the graph G17 showing the moving integration spectral wavelength λmv for each scan exposure pulse corresponding to the direction-Y position in single scan, the graph G18 showing the moving integration spectral linewidth Δλmv for each scan exposure pulse corresponding to the direction-Y position in single scan.

When the target wavelength λt is set as indicated by the graph G15, the target wavelength λt approaches Δλb and the moving integration spectral linewidth Δλmv becomes constant as indicated by the graph G17.

Setting the target spectral linewidth as indicated by the graph G16 allows the moving integration spectral linewidth Δλmv to be fixed over the range of each of the main pattern regions D, as indicated by the graph G18.

Figure 26:
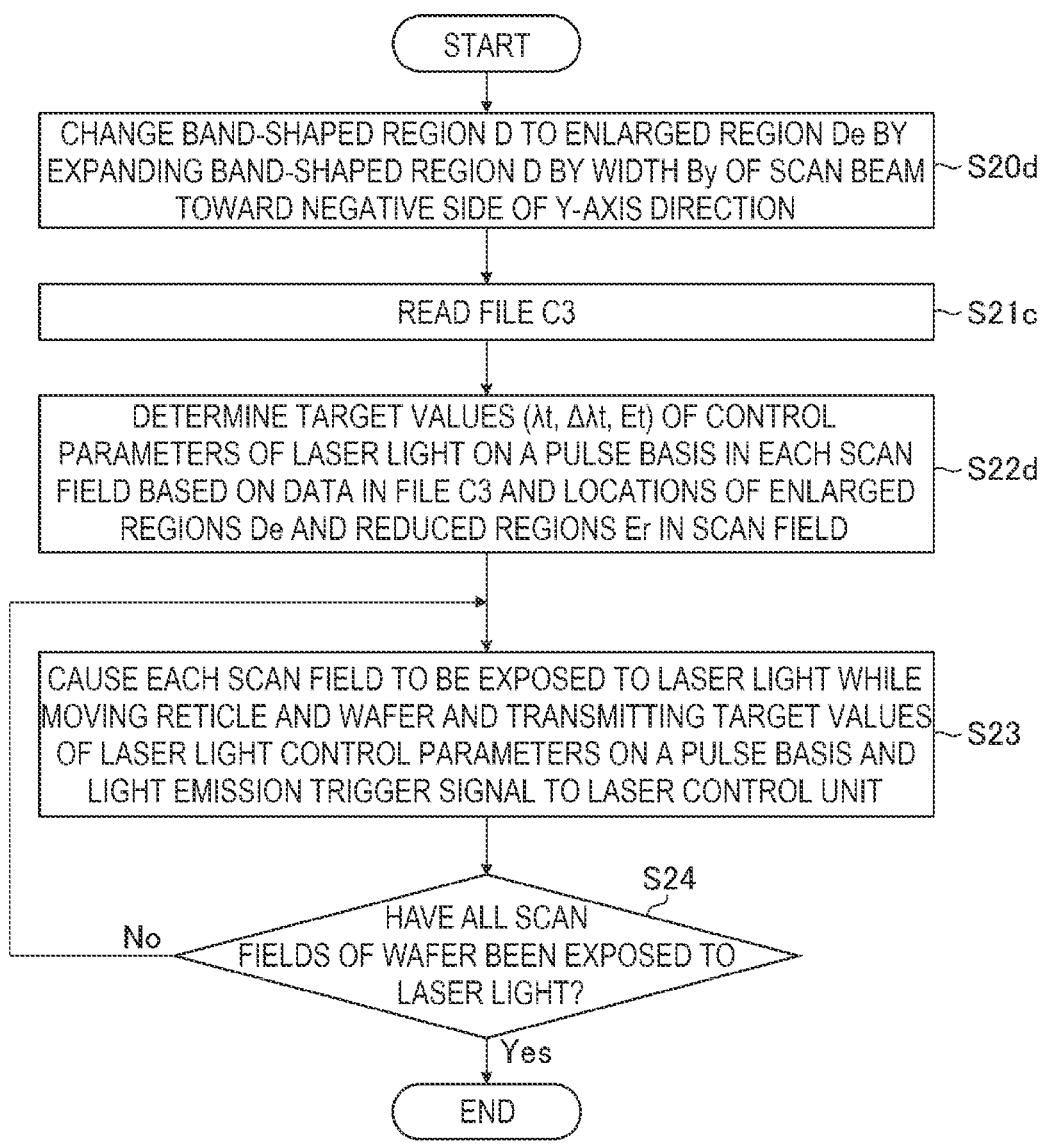
FIG. 26 is a flowchart showing an example of processes carried out by the exposure control unit in the fourth embodiment.

FIG. 26 is a flowchart showing an example of processes carried out by the exposure control unit 40 in the fourth embodiment. Differences in flowchart between FIGS. 24 and 26 will be described. The flowchart shown in FIG. 26 includes an additional step S20d before step S21c, and step S22d in place of step S22c in FIG. 24.

In step S20d, the exposure control unit 40 changes the band-shaped region D to the enlarged region De by moving the Y-axis-direction-negative-side boundary position of the region D in such a way that the range of the region D is enlarged by the beam width (width By) of the scan beam SB toward the negative side of the Y-axis direction. In response to the change from the region D to the enlarged region De, the Y-axis-direction-positive-side boundary position of the band-shaped region E moves by the width By toward the negative side of the Y-axis direction, so that the region E is reduced and changed to the reduced region Er.

In step S22d, the exposure control unit 40 calculates the target values (λt, Δλt, Et) of the laser light control parameters on a pulse basis in each scan field based on the data in the file C3 and the locations of the enlarged regions De and the reduced regions Er in the scan field. The following steps are the same as those in the flowchart of FIG. 24.

6.3 Effects and Advantages

The spectrum waveform of the pulsed laser light to which a scan field SF is exposed is a value provided by the moving integration for the number of exposure pulses $N_{SL}$. According to the fourth embodiment, the laser light with which at least the main pattern regions D are irradiated can be exposed with the optimal laser control parameters (λb, Δλb).

As described in the fourth embodiment, the technology of the present disclosure is also applicable to manufacture of electronic devices such as memory systems and CMOS image sensors having steps on the wafer during the scan exposure. According to the fourth embodiment, the performance and yield of the manufactured semiconductor devices are improved.

7. Example of Excimer Laser Apparatus Using Solid-State Laser Apparatus as Oscillator

7.1 Configuration

The laser apparatus 12 described with reference to FIG. 10 has the configuration using a narrowed-line gas laser apparatus as the oscillator 22 by way of example, and the configuration of the laser apparatus is not limited to the configuration in the example shown in FIG. 10.

Figure 27:
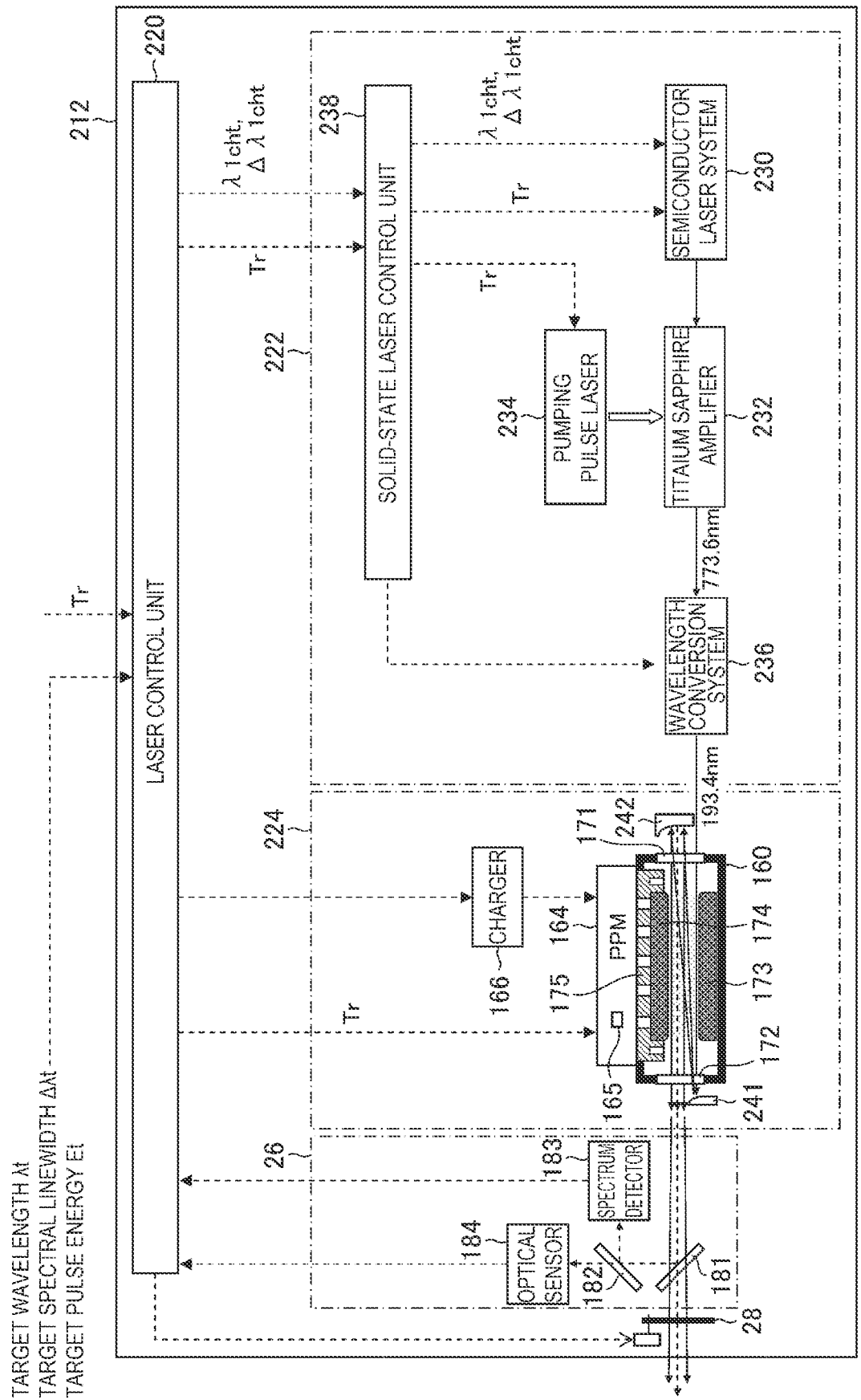
FIG. 27 shows another example of the configuration of the laser apparatus.

FIG. 27 shows another example of the configuration of the laser apparatus. In place of the laser apparatus 12 shown in FIG. 10, a laser apparatus 212 shown in FIG. 27 may be used. In the configuration shown in FIG. 27, elements that are common or similar to those in FIG. 10 have the same reference characters and will not be described.

The laser apparatus 212 shown in FIG. 27 is an excimer laser apparatus using a solid-state laser apparatus as the oscillator and includes a solid-state laser system 222, an excimer amplifier 224, and a laser control unit 220.

The solid-state laser system 222 includes a semiconductor laser system 230, a titanium sapphire amplifier 232, a pumping pulse laser 234, a wavelength conversion system 236, and a solid-state laser control unit 238.

The semiconductor laser system 230 includes a distributed feedback (DFB) semiconductor laser that outputs CW laser light having a wavelength of about 773.6 nm and a semiconductor optical amplifier (SOA) that converts the CW laser light into pulsed laser light. An example of the configuration of the semiconductor laser system 230 will be described later with reference to FIG. 28.

The titanium sapphire amplifier 232 includes a titanium sapphire crystal. The titanium sapphire crystal is disposed in the optical path of the pulsed laser light amplified in the form of pulses by the SOA of the semiconductor laser system 230. The pumping pulse laser 234 may be a laser apparatus that outputs the second harmonic of the laser light from a YLF laser. YLF (yttrium lithium fluoride) is a solid-state laser crystal expressed by a chemical formula $LiYF_4$.

The wavelength conversion system 236 contains a plurality of nonlinear optical crystals, converts the wavelength of the incident pulsed laser light, and outputs fourth-harmonic pulsed laser light. The wavelength conversion system 236 contains, for example, an LBO crystal and a KBBF crystal. The LBO crystal is a nonlinear optical crystal expressed by a chemical formula $LiB_3O_5$. The KBBF crystal is a nonlinear optical crystal expressed by a chemical formula $KBe_2BO_3F_2$. The crystals are each placed on a rotary stage (not shown) that can change the angle of incidence of the pulsed laser light incident on the crystal.

The solid-state laser control unit 238 controls the semiconductor laser system 230, the pumping pulse laser 234, and the wavelength conversion system 236 in accordance with instructions from the laser control unit 220.

The excimer amplifier 224 includes the chamber 160, the PPM 164, the charger 166, a convex mirror 241, and a concave mirror 242. The chamber 160 includes the windows 171 and 172, the pair of electrodes 173 and 174, and the electrically insulating member 175. An ArF laser gas is introduced into the chamber 160. The PPM 164 includes the switch 165 and the charging capacitor.

The excimer amplifier 224 has a configuration in which the amplification is performed by causing seed light having a wavelength of 193.4 nm to pass three times through the discharge space between the pair of electrodes 173 and 174. The seed light having the wavelength of 193.4 nm is the pulsed laser light outputted from the solid-state laser system 222.

The convex mirror 241 and the concave mirror 242 are so disposed that the pulsed laser light outputted from the solid-state laser system 222 external to the chamber 160 passes through the interior of the chamber 160 three times so that the beam enlarges.

The seed light having entered the excimer amplifier 224 and having the wavelength of about 193.4 nm is reflected off the convex mirror 241 and the concave mirror 242 and passes three times through the discharge space between the pair of discharge electrodes 173 and 174. The beam of the seed light is therefore enlarged and amplified.

7.2 Operation

When the laser control unit 220 receives the target wavelength $\lambda t$, the target spectral linewidth $\Delta\lambda t$, and the target pulse energy Et from the exposure control unit 40, the laser control unit 220 calculates a target wavelength $\lambda 1ct$ and a target spectral linewidth $\Delta\lambda 1cht$ of the pulsed laser light from the semiconductor laser system 230 that are caused to coincide with the target values with the aid, for example, of table data or an approximation formula.

The laser control unit 220 transmits the target wavelength $\lambda 1ct$ and the target spectral linewidth $\Delta\lambda 1cht$ to the solid-state laser control unit 238, and sets a charging voltage applied to the charger 166 in such a way that the pulsed laser light outputted from the excimer amplifier 224 has the target pulse energy Et.

The solid-state laser control unit 238 controls the semiconductor laser system 230 in such a way that the wavelength and spectral linewidth of the pulsed laser light outputted from the semiconductor laser system 230 approach the target wavelength $\lambda 1ct$ and the target spectral linewidth $\Delta\lambda 1cht$. The control scheme executed by the solid-state laser control unit 238 will be described later with reference to FIGS. 28 to 31.

The solid-state laser control unit 238 controls two rotary stages that are not shown in such a way that the laser light is incident on the rotary stages at angles of incidence that maximize the wavelength conversion efficiency of the LBO crystal and the KBBF crystal in the wavelength conversion system 236.

When the light emission trigger signal Tr is transmitted from the exposure control unit 40 to the laser control unit 220, trigger signals are inputted to the semiconductor laser system 230, the pumping pulse laser 234, and the switch 165 of the PPM 164 of the excimer amplifier 224 in synchronization with the light emission trigger signal Tr. As a result, a pulse current is inputted to the SOA of the semiconductor laser system 230, and pulsed laser light having undergone pulse amplification is outputted from the SOA.

The pulsed laser light is outputted from the semiconductor laser system 230 and further undergoes the pulse amplification in the titanium sapphire amplifier 232. The pulsed laser light enters the wavelength conversion system 236. As a result, the wavelength conversion system 236 outputs pulsed laser light having the target wavelength $\lambda t$.

When the laser control unit 220 receives the light emission trigger signal Tr from the exposure control unit 402, the laser control unit 220 transmits trigger signals to an SOA 260, which will be described below, of the semiconductor laser system 230, the switch 165 of the PPM 164, and the pumping pulse laser 234 in such a way that the pulsed laser light outputted from the solid-state laser system 222 discharges when entering the discharge space in the chamber 160 of the excimer amplifier 224.

As a result, the pulsed laser light outputted from the solid-state laser system 222 undergoes the three-pass amplification performed by the excimer amplifier 224. The pulsed laser light amplified by the excimer amplifier 224 is sampled by the beam splitter 181 of the monitor module 26, the pulse energy E is measured with the optical sensor 184, and the wavelength λ and the spectral linewidth Δλ are measured with the spectrum detector 183.

The laser control unit 220, based on the pulse energy E, the wavelength λ, and the spectral linewidth Δλ measured with the monitor module 26, may correct the charging voltage applied to the charger 166, and the wavelength $\lambda 1ct$ and the spectral linewidth $\Delta\lambda 1cht$ of the pulsed laser light outputted from the semiconductor laser system 230 in such a way that the difference between the pulse energy E and the target pulse energy Et, the difference between the wavelength λ and the target wavelength λt, and the difference between the spectral linewidth Δλ and the target spectral linewidth Δλt each approach zero.

7.3 Description of Semiconductor Laser System
7.3.1 Configuration

Figure 28:
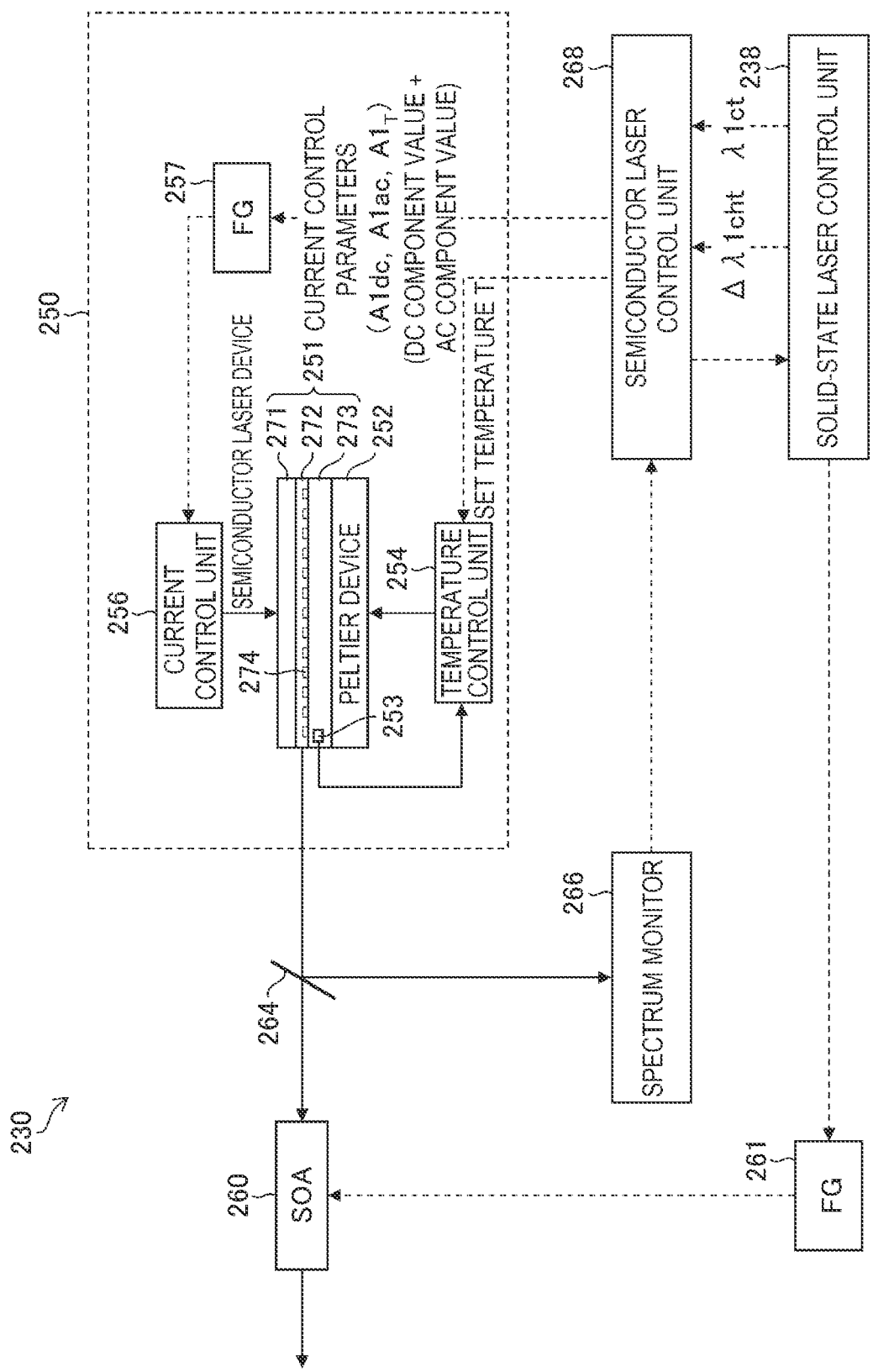
FIG. 28 shows an example of the configuration of a semiconductor laser system.

FIG. 28 shows an example of the configuration of the semiconductor laser system 230. The semiconductor laser system 230 includes a single-longitudinal-mode, distributed feedback semiconductor laser 250, the semiconductor optical amplifier (SOA) 260, a function generator (FG) 261, a beam splitter 264, a spectrum monitor 266, and a semiconductor laser control unit 268. A distributed feedback semiconductor laser is called a "DFB laser".

The DFB laser 250 outputs CW (continuous wave) laser light having the wavelength of about 773.6 nm. A DFB laser is capable of changing the oscillation wavelength under current control and/or temperature control.

The DFB laser 250 includes a semiconductor laser device 251, a Peltier device 252, a temperature sensor 253, a temperature control unit 254, a current control unit 256, and a function generator 257. The semiconductor laser device 251 includes a first cladding layer 271, an active layer 272, and a second cladding layer 273 and further includes a grating 274 at the boundary between the active layer 272 and the second cladding layer 273.

7.3.2 Operation

The oscillation center wavelength at which the DFB laser 250 oscillates can be changed by changing a set temperature T and/or a current value A of the semiconductor laser device 251.

To control the spectral linewidth by causing the wavelength at which the DFB laser 250 oscillates to chirp at high speed, the spectral linewidth can be controlled by changing at high speed the current value A of the current flowing through the semiconductor laser device 251.

That is, transmitting the values of current control parameters: a DC component value $A1dc$; an AC component variation width $A1ac$; and an AC component period $A1_T$, from the semiconductor laser control unit 268 to the function generator 257 allows high-speed control of a center wavelength $\lambda 1chc$ and the spectral linewidth $\Delta\lambda 1ch$ of the pulsed laser light outputted from the semiconductor laser system 230.

The spectrum monitor 266 may measure the wavelength, for example, by using a spectrometer or a heterodyne interferometer.

The function generator 257 outputs an electric signal having a waveform according to the current control parameters specified by the semiconductor laser control unit 268 to the current control unit 256. The current control unit 256 performs current control in such a way that a current according to the electric signal from the function generator 257 flows through the semiconductor laser device 251. The function generator 257 may be provided as a component external to the semiconductor laser 250. For example, the function generator 257 may be provided in the semiconductor laser control unit 268.

FIG. 29 is a conceptual view of the spectral linewidth achieved by the chirping. The spectral linewidth $\Delta\lambda 1ch$ is measured as the difference between a maximum wavelength and a minimum wavelength generated by the chirping.

FIG. 30 is a diagrammatic view showing the relationship among the current flowing through the semiconductor laser, a change in the wavelength due to the chirping, the spectrum waveform, and the optical intensity. A graph GA displayed in the lower left portion of FIG. 30 is a graph showing changes in the current value A of the current flowing through the semiconductor laser device 251. A graph GB displayed in the lower central portion of FIG. 30 is a graph showing the chirping produced by the current indicated by the graph GA. A graph GC displayed in the upper portion of FIG. 30 schematically shows the spectrum waveform generated by the chirping indicated by the graph GB. A graph GD displayed in the lower right portion of FIG. 30 is a graph showing changes in the optical intensity of the laser light produced by the current indicated by the graph GA and outputted from the semiconductor laser system 230.

The current control parameters of the semiconductor laser system 230 include the following values, as indicated by the graph GA.

$A1dc$: DC component value of current flowing through semiconductor laser device $A1ac$: Variation width of AC component of current flowing through semiconductor laser device (difference between local maximum and local minimum of current)

$A1_T$: Cycle of AC component of current flowing through semiconductor laser device In the example shown in FIG. 30, a triangular wave is presented as an example of the AC component out of the current control parameters, and FIG. 30 shows a case where the variation in the triangular wave current results in a small variation in optical intensity of the CW laser light outputted from the semiconductor laser 250.

The relationship between a time width $D_{TW}$ of the pluses amplified by the SOA 260 and the cycle $A1_T$ of the AC component preferably satisfies Expression (1) below.

$$D_{TW} = n \cdot A1_T \tag{1}$$

Reference character n is an integer greater than or equal to 1.

When the relationship expressed by Expression (1) is satisfied, the pulse amplification can be performed at any timing by the SOA 260 with a suppressed change in the spectrum waveform of the amplified pulsed laser light.

Even when Expression (1) is not satisfied, the width of the pulses amplified by the SOA 260 ranges, for example, from 10 to 50 ns. The cycle $A1_T$ of the AC component of the current flowing through the semiconductor laser device 251 is sufficiently shorter than the width of the pulses from the SOA 260 (time width $D_{TW}$ of amplified pulses). For example, the cycle $A1_T$ is preferably greater than or equal to 1/1000 of the width of the pulses from the SOA 260 but smaller than or equal to 1/10 of the pulse width. The cycle may further preferably be greater than or equal to 1/1000 of the pulse width but smaller than or equal to 1/100 of the pulse width.

Figure 31:
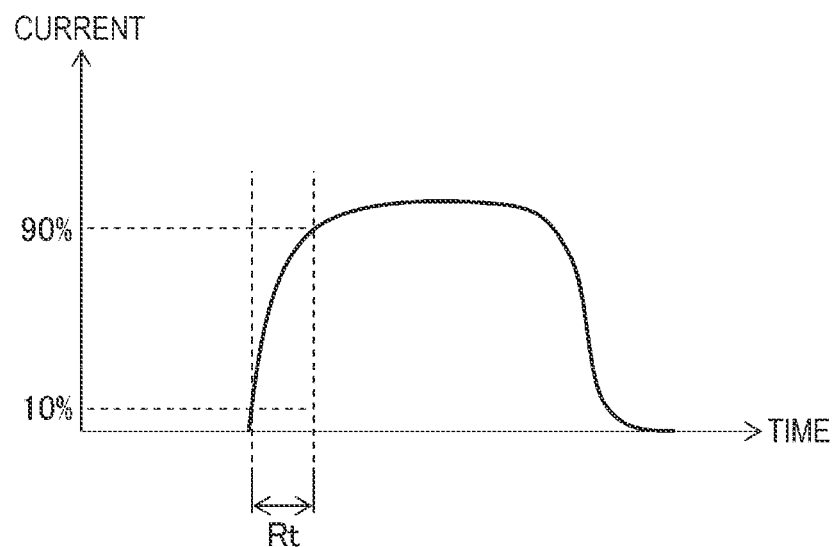
FIG. 31 is a graph showing a rising period of a semiconductor optical amplifier.

A rising period of the SOA 260 is preferably, for example, shorter than or equal to 2 ns, further preferably shorter than or equal to 1 ns. The rising period used herein refers to a period Rt required for the amplitude of the waveform of the pulse current to increase from 10% of the maximum amplitude to 90% thereof, as shown in FIG. 31.

7.3.3 Others

In the example shown in FIG. 30, the triangular wave is presented as an example of the waveform of the AC component of the current, but not necessarily. For example, a waveform that changes on a fixed cycle basis may be used. Examples of the waveform of the AC component other than a triangular wave may include a sinusoidal wave and a rectangular wave. Controlling the waveform of the AC component allows generation of a variety of target spectrum waveforms.

7.4 Effects and Advantages

The laser apparatus 212 using the solid-state laser system 222 as the oscillator has the following advantages over the case where an excimer laser is used as the oscillator.

[1] The solid-state laser system 222 can control the wavelength λ and the spectral linewidth Δλ at high speed with precision by controlling the current value A in the DFB laser 250. That is, when the laser apparatus 212 receives data on the target wavelength λt and the spectral linewidth Δλt, the laser apparatus 212 can immediately control the current value A in the DFB laser 250 to control the oscillation wavelength and the spectral linewidth at high speed, thus allowing fast and precise change in the wavelength λ and the spectral linewidth Δλ of the pulsed laser light outputted from the laser apparatus 212 on a pulse basis.

[2] Furthermore, controlling the current value in the DFB laser 250 for chirping allows generation of spectral waveforms of a variety of functions different from the typical spectral waveform.

[3] Therefore, to control the wavelength λmv or the linewidth Δλmv of the moving integration spectrum determined from the spectrum waveform of the moving integration value of the spectrum waveform as the laser control parameters, a preferable laser apparatus includes an oscillator using the solid-state laser system 222 including the DFB laser 250, and the excimer amplifier 224.

7.5 Others

An embodiment of the solid-state laser apparatus is not limited to the example shown in FIGS. 27 to 31, but may relate, for example, to a solid-state laser system including a DFB laser that outputs laser light having a wavelength of about 1547.2 nm and an SOA, and further including a wavelength conversion system that outputs eighth harmonic having the wavelength of 193.4 nm. Another embodiment of the solid-state laser apparatus may relate to a solid-state laser system that includes a CW-oscillation DFB laser and an SOA, controls the wavelength by controlling the current value of the current flowing through the DFB laser, and performs the pulse amplification by causing a pulse current to flow through the SOA.

The example in FIG. 27 shows a multipath amplifier as the excimer amplifier, but not necessarily, and the excimer amplifier may, for example, be an amplifier with an optical resonator, such as a Fabry-Perot resonator or a ring resonator.

8. Hardware Configuration of Various Control Units

A control apparatus that functions as each of the laser control unit 20, the exposure control unit 40, the lithography control unit 110, the solid-state laser control unit 238, the semiconductor laser control unit 268, and other control units can be achieved by a combination of hardware formed of one or more computers and software installed therein. The software is synonymous with a program. A programmable controller is encompassed in the concept of a computer. The computer can be formed of a CPU (central processing unit) and a memory. The CPU provided in the computer is an example of a processor.

Part or entirety of the processing functions of the control apparatus may be achieved by using an integrated circuit represented by an FPGA (field programmable gate array) and an ASIC (application specific integrated circuit).

The functions of a plurality of control apparatuses can be achieved by a single control apparatus. Further, in the present disclosure, the control apparatuses may be connected to each other via a communication network, such as a local area network and the Internet. In a distributed computing environment, a program unit may be saved in both local and remote memory storage devices.

9. Method for Manufacturing Electronic Devices

Figure 32:
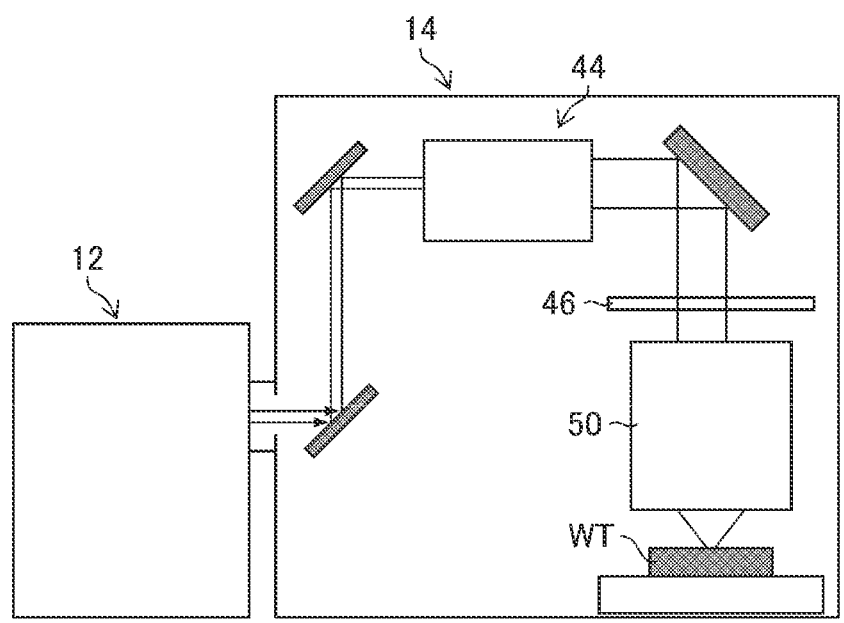
FIG. 32 schematically shows an example of the configuration of an exposure apparatus.

FIG. 32 schematically shows an example of the configuration of the exposure apparatus 14. The exposure apparatus 14 includes the illumination optical system 44 and the projection optical system 50. The illumination optical system 44 illuminates the reticle pattern of the reticle 46 placed on the reticle stage 48, which is not shown, with the laser light having entered the exposure apparatus 14 from the laser apparatus 12. The projection optical system 50 performs reduction projection on the laser light having passed through the reticle 46 to cause the laser light to be brought into focus on a workpiece that is not shown but is placed on a workpiece table WT. The workpiece may be a light sensitive substrate onto which a photoresist has been applied, such as a semiconductor wafer. The workpiece table WT may be the wafer stage 54.

The exposure apparatus 14 translates the reticle stage 48 and the workpiece table WT in synchronization with each other to expose the workpiece to the laser light having reflected the reticle pattern. Semiconductor devices can be manufactured by transferring the reticle pattern onto the semiconductor wafer in the exposure step described above and then carrying out a plurality of other steps. The semiconductor devices are an example of the "electronic devices" in the present disclosure.

The laser apparatus 12 in FIG. 32 may be the laser apparatus 212 including the solid-state laser system 222 described with reference to FIG. 27.

10. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An exposure system configured to perform scan exposure on a semiconductor substrate by irradiating a reticle with pulsed laser light, the exposure system comprising:
    a laser apparatus configured to output the pulsed laser light;
    an illumination optical system configured to guide the pulsed laser light to the reticle;
    a reticle stage configured to move the reticle; and
    a processor configured to control the output of the pulsed laser light from the laser apparatus and the movement of the reticle performed by the reticle stage,
    the reticle having a first region where a first pattern is disposed and a second region where a second pattern is disposed,
    the first and second regions each being a region continuous in a scan width direction perpendicular to a scan direction of the pulsed laser light, the first and second regions arranged side by side in the scan direction, and
    the processor configured to control the laser apparatus to output the pulsed laser light according to each of the first and second regions by changing values of control parameters of the pulsed laser light in accordance with each of the first and second regions,
    wherein let a Y-axis direction be the scan direction, and a width By be a Y-axis-direction beam width of a scan beam of the pulsed laser light that scans the reticle toward the positive side of the Y-axis direction,
    the processor is configured to
    based on information on a reticle pattern of the reticle, determine an enlarged region by changing a Y-axis-direction-negative-side boundary of the first region toward the negative side of the Y-axis direction by a distance corresponding to the width By to enlarge the first region, and determine a reduced region by changing a Y-axis-direction-positive-side boundary of the second region adjacent to a Y-axis-direction-positive side of the first region toward the negative side of the Y-axis direction by the distance corresponding to the width By to reduce the second region, and
    control the laser apparatus to output the pulsed laser light according to each of the enlarged region and the reduced region by changing the values of the control parameters of the pulsed laser light in accordance with each of the enlarged region and the reduced region.

2. The exposure system according to claim 1, wherein a length of each of the first and second regions in the scan width direction is at least 50% of a length of the reticle in the scan width direction.

3. The exposure system according to claim 1, wherein the first and second regions are each a band-shaped region having a length in the scan width direction longer than a length in the scan direction, and the first and second regions are unmixed with each other along a straight line extending in the scan width direction.

4. The exposure system according to claim 1, wherein the control parameters include at least one of a target wavelength, a target spectral linewidth, and target pulse energy.

5. The exposure system according to claim 1, wherein the first pattern is a pattern of a semiconductor device that requires higher resolution than the second pattern.

6. The exposure system according to claim 1, wherein the laser apparatus is an excimer laser apparatus including
    an oscillator, and
    an amplifier configured to amplify the pulsed laser light outputted from the oscillator, and
    the oscillator includes a line narrowing module.

7. A method for manufacturing electronic devices, the method comprising performing scan exposure on a light sensitive substrate with a reticle irradiated with pulsed laser light to manufacture the electronic devices by using an exposure system including
    a laser apparatus configured to output the pulsed laser light,
    an illumination optical system configured to guide the pulsed laser light to the reticle,
    a reticle stage configured to move the reticle, and
    a processor configured to control the output of the pulsed laser light from the laser apparatus and the movement of the reticle performed by the reticle stage,
    the reticle having a first region where a first pattern is disposed and a second region where a second pattern is disposed,
    the first and second regions each being a region continuous in a scan width direction perpendicular to a scan direction of the pulsed laser light, the first and second regions arranged side by side in the scan direction, and
    the processor configured to control the laser apparatus to output the pulsed laser light according to each of the first and second regions by changing values of control parameters of the pulsed laser light in accordance with each of the first and second regions,
    wherein let a Y-axis direction be the scan direction, and a width By be a Y-axis-direction beam width of a scan beam of the pulsed laser light that scans the reticle toward the positive side of the Y-axis direction,
    the processor is configured to
    based on information on a reticle pattern of the reticle, determine an enlarged region by changing a Y-axis-direction-negative-side boundary of the first region toward the negative side of the Y-axis direction by a distance corresponding to the width By to enlarge the first region, and determine a reduced region by changing a Y-axis-direction-positive-side boundary of the second region adjacent to a Y-axis-direction-positive side of the first region toward the negative side of the Y-axis direction by the distance corresponding to the width By to reduce the second region, and
    control the laser apparatus to output the pulsed laser light according to each of the enlarged region and the reduced region by changing the values of the control parameters of the pulsed laser light in accordance with each of the enlarged region and the reduced region.

* * * * *